(12) United States Patent
Fujimaki et al.

(10) Patent No.: US 10,734,494 B2
(45) Date of Patent: Aug. 4, 2020

(54) SEMICONDUCTOR DEVICE AND MANUFACTURING METHOD FOR SEMICONDUCTOR DEVICE

(71) Applicant: LAPIS Semiconductor Co., Ltd., Yokohama (JP)

(72) Inventors: Hirokazu Fujimaki, Yokohama (JP); Koichi Kaneko, Yokohama (JP)

(73) Assignee: LAPIS SEMICONDUCTOR CO., LTD., Yokohama (JP)

( * ) Notice: Subject to any disclaimer, the term of this patent is extended or adjusted under 35 U.S.C. 154(b) by 0 days.

(21) Appl. No.: 16/113,907

(22) Filed: Aug. 27, 2018

(65) Prior Publication Data

US 2019/0067432 A1 Feb. 28, 2019

(30) Foreign Application Priority Data

Aug. 28, 2017 (JP) ................. 2017-163046

(51) Int. Cl.
*H01L 29/15* (2006.01)
*H01L 29/423* (2006.01)
*H01L 27/12* (2006.01)
*H01L 29/417* (2006.01)
*H01L 29/20* (2006.01)
(Continued)

(52) U.S. Cl.
CPC ...... *H01L 29/4238* (2013.01); *H01L 27/1203* (2013.01); *H01L 27/1218* (2013.01); *H01L 27/1222* (2013.01); *H01L 27/1225* (2013.01); *H01L 27/1251* (2013.01); *H01L 29/16* (2013.01); *H01L 29/2003* (2013.01); *H01L 29/41733* (2013.01); *H01L 29/41758* (2013.01); *H01L 29/7786* (2013.01); *H01L 29/7869* (2013.01); *H01L 29/78603* (2013.01);
(Continued)

(58) Field of Classification Search
CPC .................................. H01L 29/4238
USPC .......................................... 257/76
See application file for complete search history.

(56) References Cited

U.S. PATENT DOCUMENTS 4,631,426 A * 12/1986 Nelson ............... H03K 19/0952
326/117
2002/0096106 A1* 7/2002 Kub .................... H01L 21/2007
117/94
(Continued)

FOREIGN PATENT DOCUMENTS

JP 2002-231820 A 8/2002
JP 2010-74082 A 4/2010
JP 2014-187059 A 10/2014

*Primary Examiner* — Ajay Arora
(74) *Attorney, Agent, or Firm* — Rabin & Berdo, P.C.

(57) ABSTRACT

A semiconductor device includes insulating substrate; a compound semiconductor layer provided in a first region of a surface of the insulating substrate; and a silicon layer provided in a second region, differing from the first region, of the surface of the insulating substrate. The semiconductor device further includes: a first gate electrode provided on a surface of the compound semiconductor layer; a pair of conductive members provided at positions on the surface of the compound semiconductor layer to sandwich the first gate electrode between the pair of conductive members; a second gate electrode provided on a surface of the silicon layer; and a pair of diffusion layers provided at positions in the silicon layer to sandwich the second gate electrode between the pair of diffusion layers. One of the conductive members is electrically connected to one of the diffusion layers.

16 Claims, 18 Drawing Sheets

(51) Int. Cl.
*H01L 29/16* (2006.01)
*H01L 29/786* (2006.01)
*H01L 29/778* (2006.01)

(52) U.S. Cl.
CPC .. *H01L 29/78618* (2013.01); *H01L 29/78657* (2013.01); *H01L 29/78681* (2013.01)

(56) References Cited

U.S. PATENT DOCUMENTS

| | | | | |
|---|---|---|---|---|
| 2004/0061129 | A1* | 4/2004 | Saxler | H01L 29/66462 257/192 |
| 2005/0077550 | A1* | 4/2005 | Inaba | H01L 21/28132 257/250 |
| 2005/0269643 | A1* | 12/2005 | Furuta | H01L 29/42376 257/365 |
| 2010/0295104 | A1* | 11/2010 | Kaper | H01L 21/8258 257/288 |
| 2015/0270255 | A1* | 9/2015 | Ikeda | H01L 27/0255 257/77 |

* cited by examiner

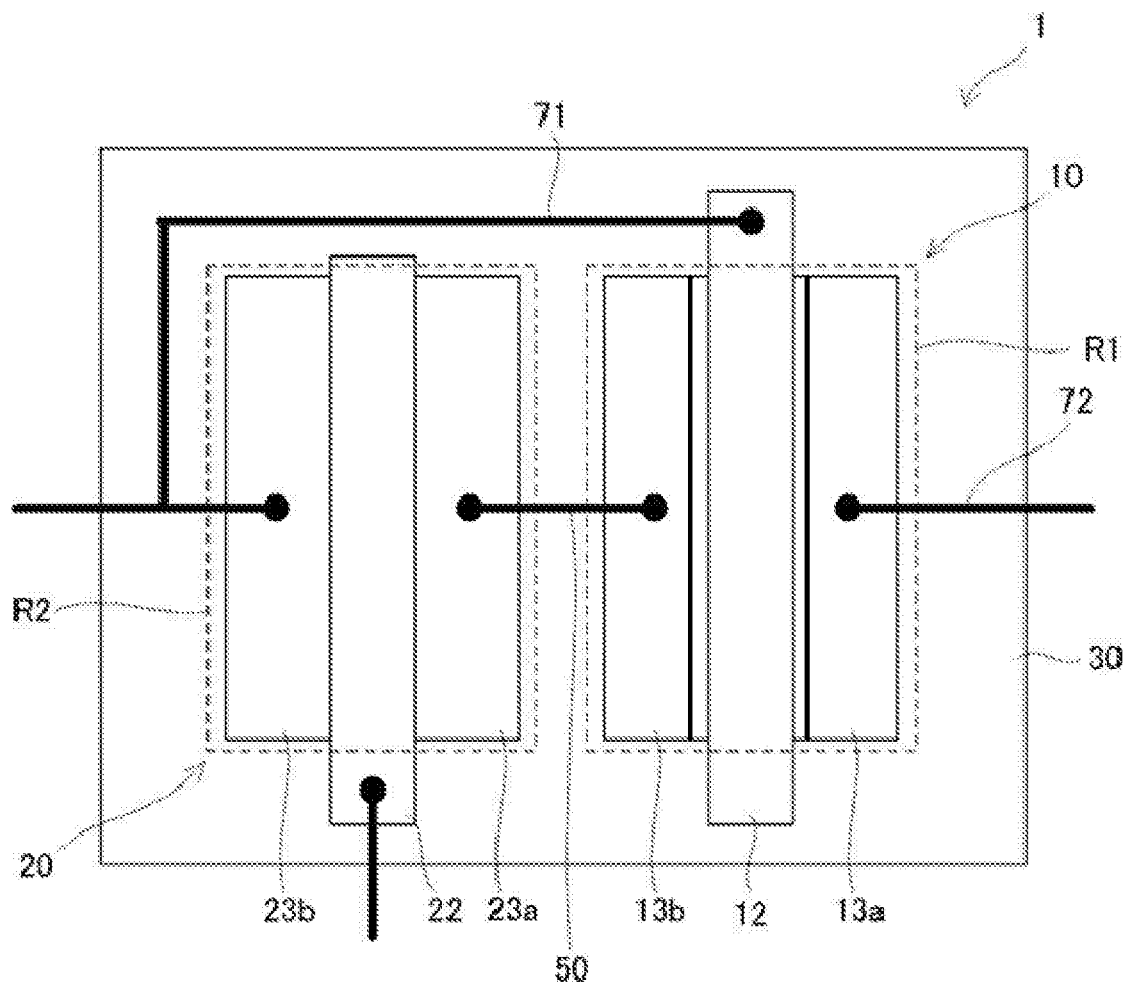

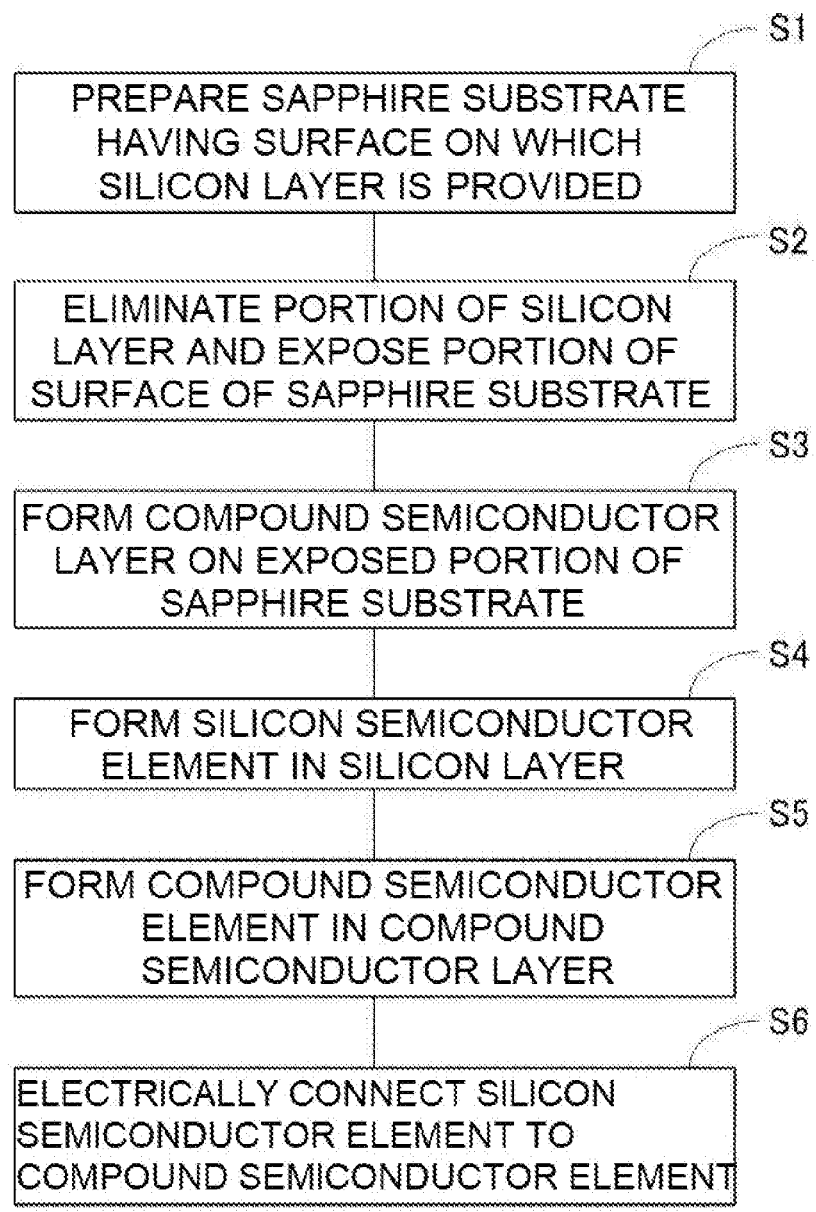

SEMICONDUCTOR DEVICE AND MANUFACTURING METHOD FOR SEMICONDUCTOR DEVICE

CROSS REFERENCE TO RELATED APPLICATIONS

This application is based upon and claims the benefit of priority of the prior Japanese Patent Application No. 2017-163046, filed on Aug. 28, 2017, the entire contents of which are incorporated herein by reference.

BACKGROUND OF THE INVENTION

The present invention relates to a semiconductor device and a manufacturing method The following technique is known as a technique for combining a compound semiconductor element constituted of a compound semiconductor such as GaN with a silicon semiconductor element constituted of silicon.

Patent Application Laid-Open Publication No. 2014-187059 (Patent Document 1), for example, discloses a semiconductor device in which a chip having formed therein a normally-ON transistor constituted of a compound semiconductor such as GaN is in a cascode connection with a chip having formed therein a normally-OFF transistor constituted of silicon.

Japanese Patent Application Laid-Open Publication No. 2002-231820 (Patent Document 2), for example, discloses a power semiconductor device constituting a normally-OFF switch in which a normally-OFF MOSFET made of Si is formed on a normally-ON JFET made of SiC.

Japanese Patent Application Laid-Open Publication No. 2010-74082 (Patent Document 3), for example, discloses a semiconductor device including a silicon single crystal substrate, a silicon LSI formed on the silicon single crystal substrate, a compound semiconductor element formed on the silicon single crystal substrate, and a metal wiring line that electrically connects the silicon LSI to the compound semiconductor element.

SUMMARY

According to the semiconductor device disclosed in Patent Document 1, a wire is used to connect chips, and there is a risk that the wire resistance component and inductance component can inhibit high speed operation and low ON-resistance characteristics of the compound semiconductor element.

According to the semiconductor device disclosed in Patent Document 2, a JFET made of SiC and a MOSFET made of Si are vertically stacked, and thus, epitaxial growth is in heavy use, which means a more complex manufacturing process and a higher manufacturing cost. Also, the laminate structure of silicon-silicon oxide film-SiC functions as a capacitor, which can pose the risk of causing capacitance coupling and resulting in a defect in the operation of the semiconductor element.

According to the semiconductor device disclosed in Patent Document 3, the compound semiconductor element is formed directly on the silicon single crystal substrate, and thus, there is a risk that high voltages applied to the compound semiconductor element affect the silicon LSI through the silicon single crystal substrate, causing operational defects in the silicon LSI. Furthermore, the compound semiconductor element and the silicon LSI share a silicon single crystal substrate, and thus, there is a risk of a latch-up being caused by application of a high voltage to the compound semiconductor element or the like.

The present invention takes into consideration the above points, and an object thereof is to improve the performance of a semiconductor device including a compound semiconductor element and a silicon semiconductor element.

A semiconductor device according to a first aspect of the present invention includes: an insulating substrate; a compound semiconductor layer provided in a first region of a surface of the insulating substrate; and a silicon layer provided in a second region, differing from the first region, of the surface of the insulating substrate.

A semiconductor device according to a second aspect of the present invention includes: a first switch including a first compound semiconductor element that is provided in a compound semiconductor layer formed in a first region on an insulating substrate, and a first silicon semiconductor element that is provided in a silicon layer formed in the first region on the insulating substrate and that is electrically connected to the compound semiconductor element; and a second switch that is electrically connected to the first switch, the second switch including a second compound semiconductor element that is provided in a compound semiconductor layer formed in a second region differing from the first region on an insulating substrate, and a second silicon semiconductor element that is provided in a silicon layer formed in the second region on the insulating substrate and that is electrically connected to the second compound semiconductor element.

A semiconductor device according to a third aspect of the present invention includes: an insulating substrate; a diffusion layer formed in a silicon layer provided on the insulating substrate; a conductive member formed on a surface of the compound semiconductor layer provided on the insulating substrate; and a connecting portion where the diffusion layer and the conductive member are electrically connected.

A semiconductor device according to a fourth aspect of the present invention includes: a compound semiconductor element that is formed in a compound semiconductor layer provided on an insulating substrate, a first end of the compound semiconductor element being electrically connected to an input node; and a silicon semiconductor element that is formed in a silicon layer provided on the insulating substrate, and that is electrically connected to a second end of the compound semiconductor element.

A manufacturing method for a semiconductor device of the present invention includes: preparing an insulating substrate, a surface of which is provided with a silicon layer; removing a portion of the silicon layer to expose a portion of the surface of the insulating substrate; forming a compound semiconductor layer on an exposed portion of the insulating substrate; forming a silicon semiconductor element in the silicon layer after forming the compound semiconductor layer; forming a compound semiconductor element in the compound semiconductor layer; and electrically connecting the silicon semiconductor element to the compound semiconductor element.

According to the present invention, it is possible to improve the performance of a semiconductor device including a compound semiconductor element and a silicon semiconductor element.

BRIEF DESCRIPTION OF THE DRAWINGS

FIG. 2A is a plan view showing a conceptual structure of a semiconductor device according to an embodiment of the present invention.

FIG. 4 shows a process flow of a manufacturing method for a semiconductor device according to an embodiment of the present invention.

DETAILED DESCRIPTION OF EMBODIMENTS

Figure 1:
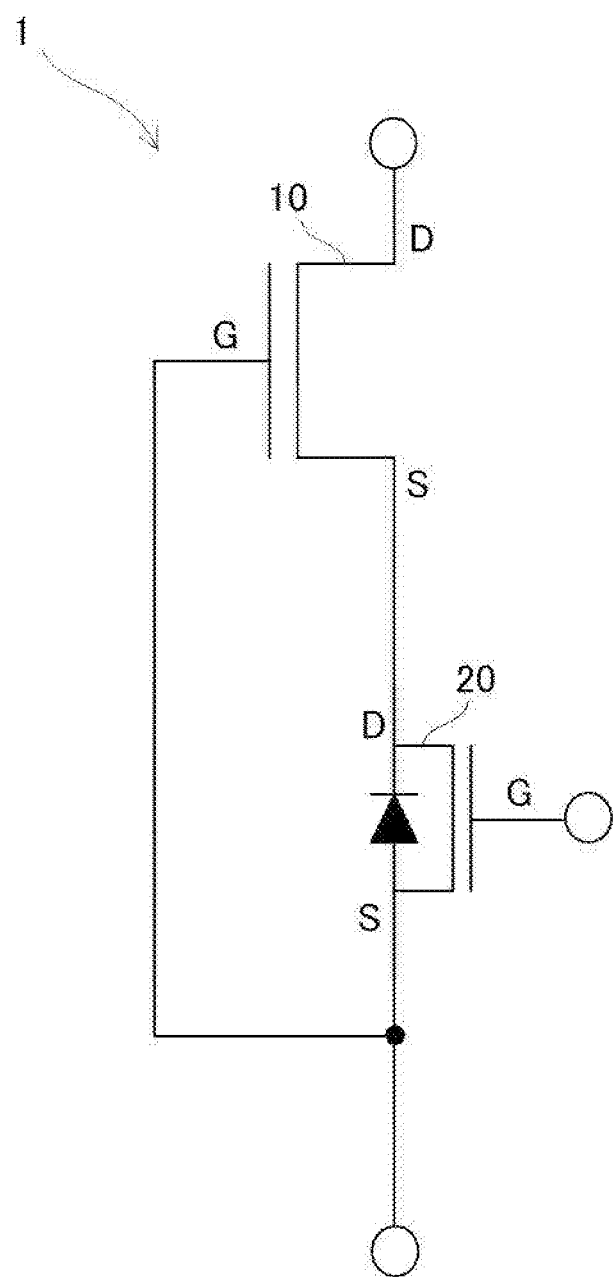
FIG. 1 is an equivalent circuit diagram of a semiconductor device according to an embodiment of the present invention.

Embodiments of the present invention will be explained below with reference to the drawings. Substantially same or equivalent components or portions in the drawings are assigned the same reference characters.

Embodiment 1

FIG. 1 is an equivalent circuit diagram of a semiconductor device 1 according to Embodiment 1 of the present invention. The semiconductor device 1 has a normally-ON first transistor 10 that is a compound semiconductor element and a normally-OFF second transistor 20 that is a silicon semiconductor element. In the present specification and claims, the term "compound semiconductor" element refers to a semiconductor element made of a semiconductor material which is made up of two or more elements forming a compound. Examples include gallium arsenide (GaAs), gallium nitride (GaN), indium phosphide (InP), zinc sulphide (ZnS), and zinc selenide (ZnSe). In one embodiment, the compound semiconductor element includes two or more elements and the silicon semiconductor element includes a semiconductor material made up of only one element—silicon—and is not made up of a compound of different elements. In one embodiment, the compound semiconductor material of the compound semiconductor element may also include silicon, such as silicon carbide (SiC) and silicon germanium (SiGe). In another embodiment, the compound semiconductor element does not include silicon. The above-described materials are provided by way of example, and embodiments of the invention are not limited to the above materials. The first transistor 10 and the second transistor 20 are in a cascode connection. That is, the source of the first transistor 10 is connected to the drain of the second transistor 20, and the gate of the first transistor 10 is connected to the source of the second transistor 20. By putting the first transistor 10 and the second transistor 20 in a cascode connection, it is possible to form a normally-OFF switch using the normally-ON first transistor 10. ON/OFF control of the switch can be performed by supplying a control signal to the gate of the second transistor 20.

Figure 2B:
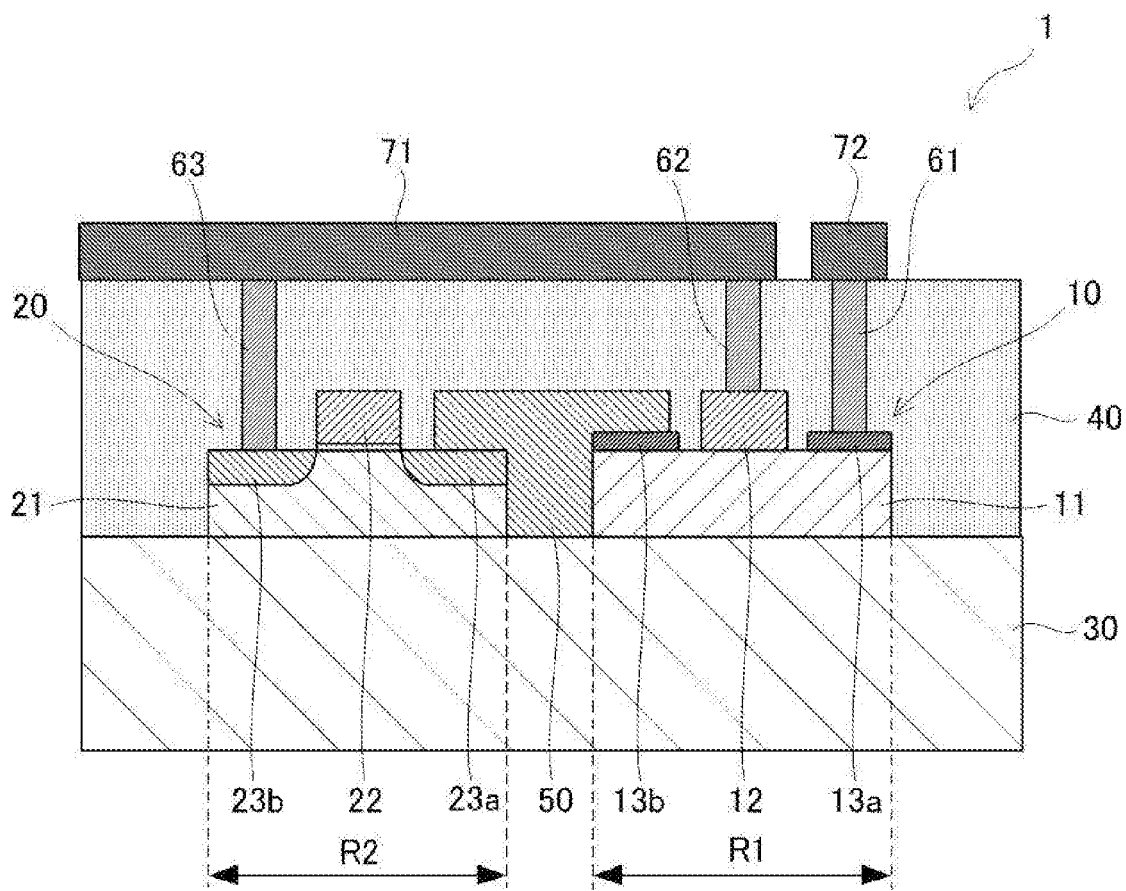
FIG. 2B is a cross-sectional view showing a conceptual structure of the semiconductor device according to the embodiment of the present invention shown in FIG. 2A.

FIG. 2A is a plan view showing a conceptual structure of the semiconductor device 1, and FIG. 2B is a cross-sectional view showing a conceptual structure of the semiconductor device 1. The semiconductor device 1 has a compound semiconductor layer 11 including a compound semiconductor provided in a first region R1 on the surface of a sapphire substrate 30, which is an insulating substrate, and a silicon layer 21 including silicon provided in a second region R2 of the sapphire substrate. Examples of a compound semiconductor constituting the compound semiconductor layer 11 include compound semiconductors other than oxide semiconductors, such as a GaN-type semiconductor, a GaAs-type semiconductor, or an InP-type semiconductor. Other examples of a compound semiconductor constituting the compound semiconductor layer 11 may include oxide semiconductors such as gallium oxide ($Ga_2O_3$), indium oxide ($In_2O_3$), or aluminum oxide ($Al_2O_3$). The compound semiconductor layer 11 and the silicon layer 21 are adjacent to each other on the sapphire substrate 30. In the example shown in FIGS. 2A and 2B, the compound semiconductor layer 11 and the silicon layer 21 are at a distance from each other with a gap therebetween, but may be in contact with each other. The first transistor 10 is formed on the compound semiconductor layer 11, and the second transistor 20 is formed on the silicon layer 21.

The first transistor 10 has a gate electrode 12 provided on the surface of the compound semiconductor layer 11, and a pair of conductive members 13a and 13b provided at positions on the surface of the compound semiconductor layer 11 to sandwich the gate electrode 12 therebetween. The conductive members 13a and 13b are made of a metal such as Ti that can be in Ohmic contact with the compound semiconductor layer 11, for example. The conductive member 13a functions as the drain electrode and the conductive member 13b functions as the source electrode. The gate electrode 12 is made of a metal such as $AgO_X$ that can be in Schottky contact with the compound semiconductor layer 11, for example. In other words, the first transistor 10 may be a MESFET (metal-semiconductor field effect transistor). Alternatively, the first transistor 10 may be an HEMT (high electron mobility transistor). In such a case, the compound semiconductor layer 11 may include a plurality of layers forming a heterojunction structure. As one example, the compound semiconductor layer 11 may have a heterojunction structure in which a buffer layer made of a GaN-type semiconductor, an active layer made of undoped GaN, and a surface barrier layer made of AlGaN are stacked.

The second transistor 20 has a gate electrode 22 provided on the surface of the silicon layer 21, and a drain diffusion layer 23a and a source diffusion layer 23b provided at positions on the surface of the silicon layer 21 to sandwich the gate electrode 22 therebetween. A gate insulating film made of an insulator such as $SiO_2$ may be provided between the gate electrode 22 and the silicon layer 21. That is, the second transistor 20 may be a MOSFET (metal-oxide-semiconductor field effect transistor).

The first transistor 10 and the second transistor 20 are covered by an insulating film 40 made of an insulator such as $SiO_2$. Plugs 61, 62, and 63 that reach the conductive member 13a, the gate electrode 12, and the source diffusion layer 23b, respectively, are provided through the insulating film 40 from the surface thereof. The surface of the insulating film 40 is provided with a wiring line 71 that connects the plug 62 to the plug 63, and a wiring line connected to the plug 61. The gate electrode 12 of the first transistor 10 is electrically connected to the source diffusion layer 23b of the second transistor 20 through the plug 62, the wiring line 71, and the plug 63.

The conductive member 13b, which functions as the source electrode of the first transistor 10, and the drain diffusion layer 23a of the second transistor 20 are disposed adjacent to each other with a gap therebetween. The conductive member 13b and the drain diffusion layer 23a are electrically connected to each other by a conductor 50 that straddles the boundary area between the compound semiconductor layer 11 and the silicon layer 21.

Figure 3A:
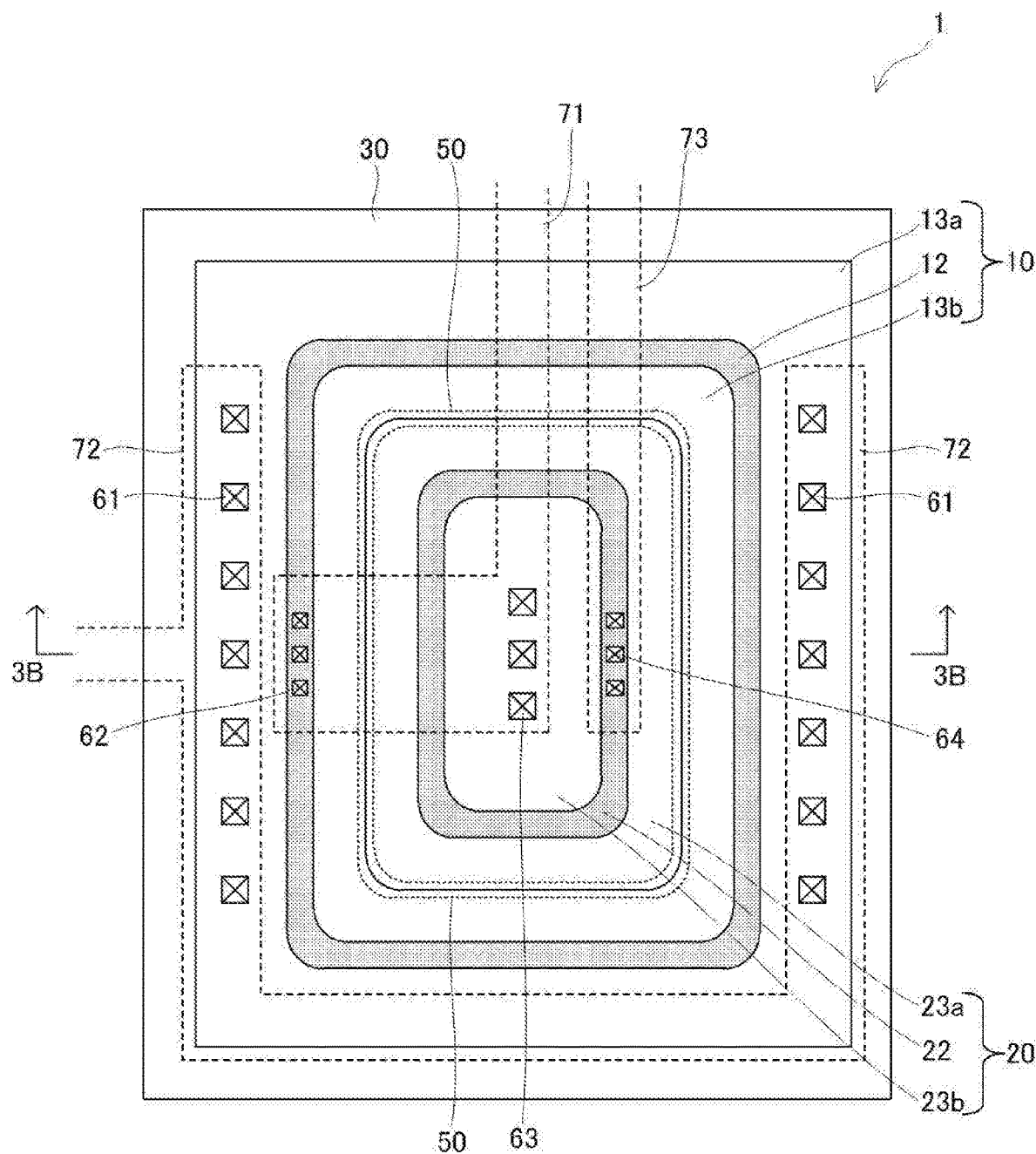
FIG. 3A is a plan view showing an example of a layout of a semiconductor device according to an embodiment of the present invention.
Figure 3B:
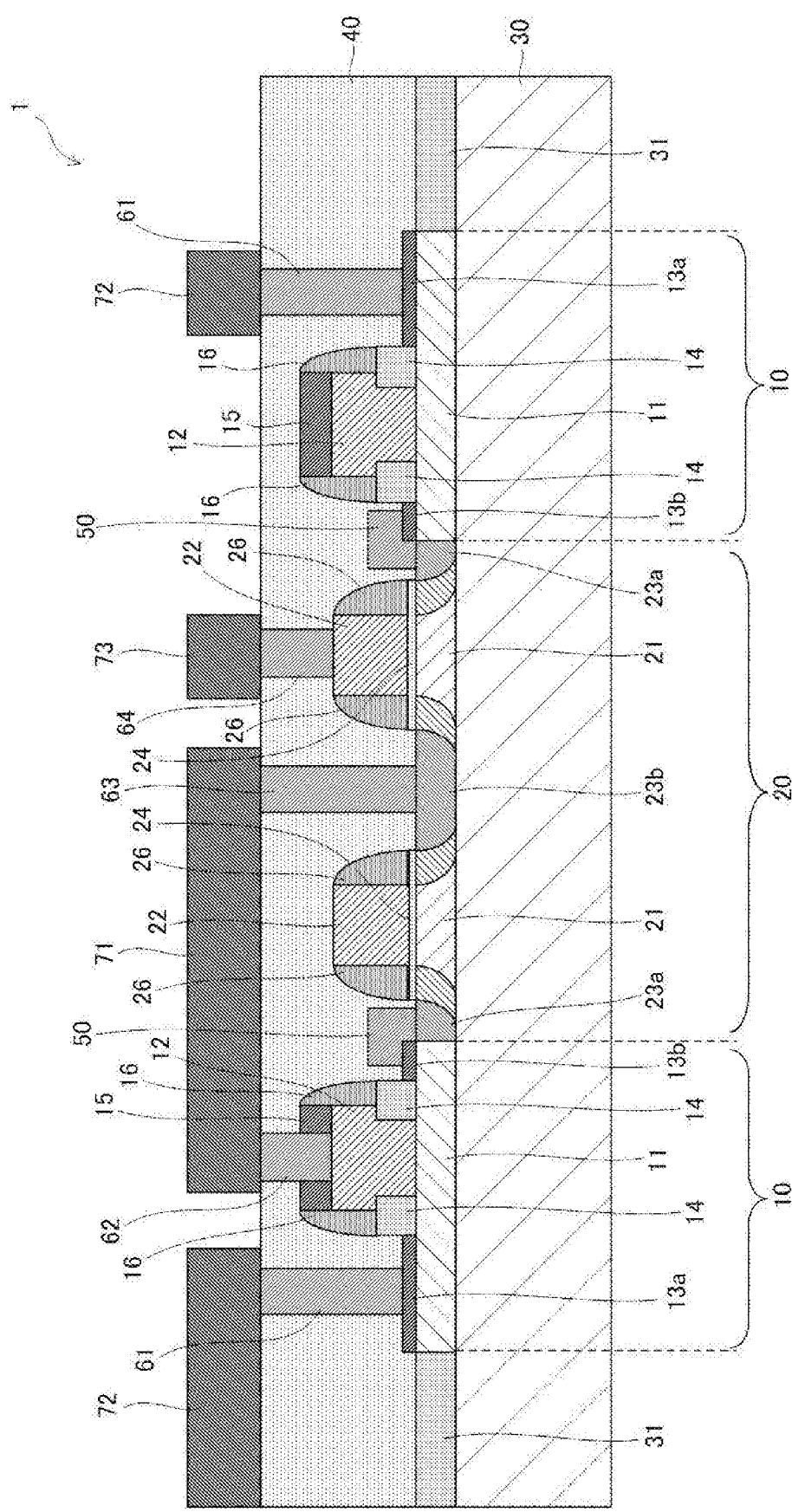
FIG. 3B is a cross-sectional view of FIG. 3A along the line 3B-3B.

FIG. 3A is a plan view showing an example of a layout of the semiconductor device 1, and FIG. 3B is a cross-sectional view of FIG. 3A along the line 3B-3B. In FIG. 3A, dashed lines are used to define the edges of the wiring lines 71, 72, and 73 and the conductor 50 in relation to the other elements of the semiconductor device 1.

The gate electrode 12 of the first transistor 10 provided on the surface of the compound semiconductor layer 11 and the gate electrode 22 of the second transistor 20 provided on the surface of the silicon layer 21 are both loops. The gate electrode 22 of the second transistor 20 is disposed to the inside of the loop shape of the gate electrode 12 of the first transistor 10, and both gate electrodes are disposed to be parallel to each other. In other words, the gate electrodes 12 and 22 form a double ring.

The conductive member 13a functioning as the drain electrode and the conductive member 13b functioning as the source electrode are provided at positions on the surface of the compound semiconductor layer 11 to sandwich the gate electrode 12 of the first transistor 10 therebetween. The conductive members 13a and 13b are provided along the loop shape of the gate electrode 12, and the first transistor 10 overall has a loop shape. The conductive members 13a and 13b are made of a metal such as titanium (Ti) that can be in Ohmic contact with the compound semiconductor layer 11, for example. The gate electrode 12 is made of a metal such as $AgO_X$ that can be in Schottky contact with the compound semiconductor layer 11, for example. In other words, the first transistor 10 may be a MESFET. In the present embodiment, the conductive member 13a constituting the drain electrode is disposed to the outside of the gate electrode 12 having a loop shape, and the conductive member 13b constituting the source electrode is disposed to the inside of the gate electrode 12.

At the bottom of the gate electrode 12, an insulating film 14 made of $SiO_2$ or the like is provided, and the gate electrode 12 is in contact with the compound semiconductor layer 11 at an opening provided in the insulating film 14. On the top surface of the gate electrode 12 an insulating film 15 made of an insulator such as $Si_3N_4$ used as a hard mask when patterning the gate electrode 12 is provided. The side faces of the laminate constituted of the gate electrode 12 and the insulating film 15 are covered by side walls 16 made of an insulator such as $Si_3N_4$.

Meanwhile, the second transistor 20 is disposed to the inside of the loop shape of the first transistor 10. The drain diffusion layer 23a and the source diffusion layer 23b are provided at positions on the surface of the silicon layer 21 to sandwich the gate electrode 22 of the second transistor 20 between the drain diffusion layer 23a and the source diffusion layer 23b. The drain diffusion layer 23a and the source diffusion layer 23b are provided along the loop shape of the gate electrode 22. In the present embodiment, the drain diffusion layer 23a is disposed to the outside of the gate electrode 22 having a loop shape, and the source diffusion layer 23b is disposed to the inside of the gate electrode 22.

A gate insulating film 24 made of an insulator such as SiO$_2$ may be provided between the gate electrode 22 and the silicon layer 21. In other words, the second transistor 20 may be a MOSFET. The side faces of the gate electrode 22 are covered by side walls 26 made of an insulator such as Si$_3$N$_4$.

In the present embodiment, the second transistor 20 is disposed to the inside of the first transistor 10, and the conductive member 13b, which constitutes the source electrode of the first transistor 10, and the drain diffusion layer 23a of the second transistor 20 are adjacent to each other. The boundary area between the conductive member 13b and the drain diffusion layer 23a (that is, the boundary area between the compound semiconductor layer 11 and the silicon layer 21) is arranged between the gate electrode 12 of the first transistor 10 and the gate electrode 22 of the second transistor 20. The conductive member 13b and the drain diffusion layer 23a are electrically connected to each other by the conductor 50, which straddles the boundary area between the compound semiconductor layer 11 and the silicon layer 21 and is connected to both the conductive member 13b and the drain diffusion layer 23a. As shown in FIG. 3A, the conductor 50 may be provided in a loop shape along the boundary area between the conductive member 13b and the drain diffusion layer 23a.

The first transistor 10 and the second transistor 20 are covered by an insulating film 40 made of an insulator such as SiO$_2$. Plugs 61, 62, 63, and 64 that reach the conductive member 13a, the gate electrode 12, the source diffusion layer 23b, and the gate electrode 22, respectively, are provided through the insulating film 40 from the surface thereof. The surface of the insulating film 40 is provided with a wiring line 71 that connects the plug 62 to the plug 63, a wiring line 72 connected to the plug 61, and a wiring line connected to the plug 64. The gate electrode 12 of the first transistor 10 is electrically connected to the source diffusion layer 23b of the second transistor 20 through the plug 62, the wiring line 71, and the plug 63.

Below, a manufacturing method for the semiconductor device 1 will be described. First, the overall flow of the manufacturing method for the semiconductor device 1 will be described with reference to the process flow shown in FIG. 4.

In step S1, the sapphire substrate 30, the surface of which is provided with the silicon layer 21, is prepared. In step S2, portions of the silicon layer 21 are removed to expose portions of the surface of the sapphire substrate 30. In step S3, the compound semiconductor layer 11 is formed in exposed portions of the sapphire substrate 30. In step S4, a silicon semiconductor element (second transistor 20) is formed in the silicon layer 21. In step S5, a compound semiconductor element (first transistor 10) is formed in the compound semiconductor layer 11. In step S6, the silicon semiconductor element (second transistor 20) is electrically connected to the compound semiconductor element (first transistor 10).

The formation of the compound semiconductor layer 11 on the sapphire substrate 30 may be performed by a metal-organic chemical vapor deposition (MOCVD) method. In such a case, heat treatment at a relatively high temperature is required, and thus, it is preferable that the step of forming the silicon semiconductor element (second transistor 20) on the silicon layer 21 be performed after forming the compound semiconductor layer 11 on the surface of the sapphire substrate 30. The compound semiconductor element (first transistor 10) may be formed prior to forming the silicon semiconductor element (second transistor 20).

Below, a specific example of the manufacturing method for the semiconductor device 1 will be described with reference to FIGS. 5A to 5O. In the description below, an example will be shown in which a MESFET is formed as the first transistor 10 in the compound semiconductor layer, and a MOSFET is formed as the second transistor 20 in the silicon layer. Also, in the description below, the layout shown in FIGS. 3A and 3B is used.

Figure 5A:
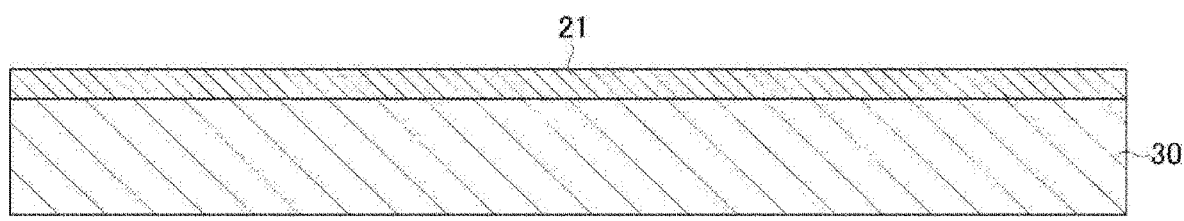
FIG. 5A is a cross-sectional view showing one example of a manufacturing method for a semiconductor device according to an embodiment of the present invention.

First, an SOS substrate (silicon on sapphire substrate) in which the silicon layer 21 made of a silicon single crystal is formed to a thickness of approximately 150 nm on the sapphire substrate 30 having a thickness of approximately 600 μm and having a c-plane orientation is prepared (FIG. 5A). In the present embodiment, the SOS substrate serves as the starting material. The SOS substrate can be produced by any desired method including a conventional wafer bonding technique, polishing technique, smart cutting technique, and the like. Also, the sapphire substrate 30 may be prepared with the silicon layer 21 being formed on the sapphire substrate 30 in the process of producing the SOS substrate.

Figure 5B:
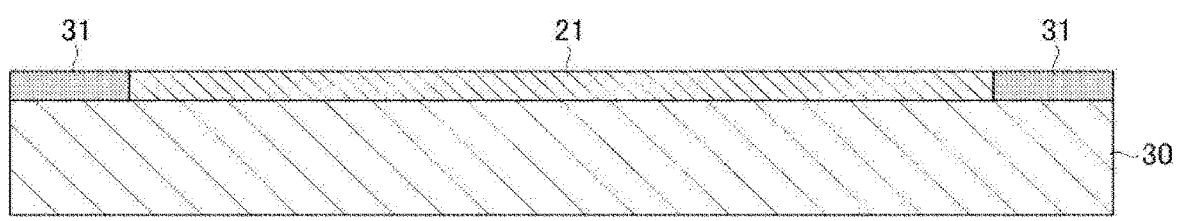
FIG. 5B is a cross-sectional view showing one example of a manufacturing method for a semiconductor device according to an embodiment of the present invention.

Next, an insulating separation film 31 made of an insulator such as SiO$_2$ is formed in prescribed positions on the silicon layer 21 (FIG. 5B) by a LOCOS (local oxidation of silicon) method. LOCOS is a method in which a pad thermally oxidized film and a silicon nitride film are stacked on the surface of the silicon layer 21, photolithography and etching are performed to pattern the silicon nitride film, and in exposed portions of the pad thermally oxidized film, silicon regions are selectively thermally oxidized.

Figure 5C:
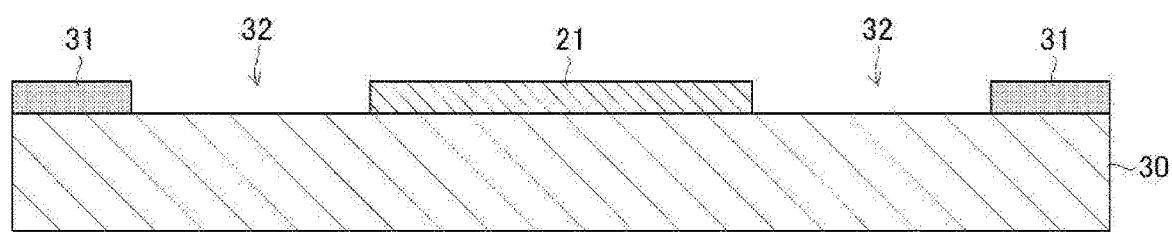
FIG. 5C is a cross-sectional view showing one example of a manufacturing method for a semiconductor device according to an embodiment of the present invention.

Next, by partially etching the silicon layer 21, portions of the sapphire substrate 30 are exposed. In the present embodiment, the silicon layer 21 is etched such that a removed region 32 of the silicon layer 21 surrounds the outside of the remaining region of the silicon layer 21 (FIG. 5C).

Figure 5D:
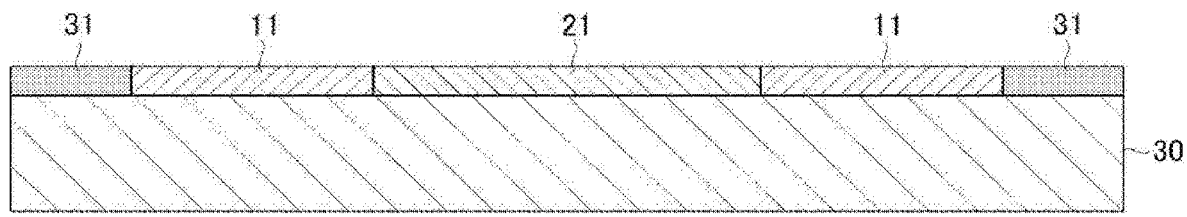
FIG. 5D is a cross-sectional view showing one example of a manufacturing method for a semiconductor device according to an embodiment of the present invention.

Next the compound semiconductor layer 11 is formed on the surface of the sapphire substrate 30 (FIG. 5D) by the MOCVD method. In the present embodiment, the compound semiconductor layer 11 is formed in a region surrounding the outer periphery of the silicon layer 21. If an HEMT is to be formed as the first transistor 10 in the compound semiconductor layer 11, then the compound semiconductor layer 11 can have a configuration in which a buffer layer made of a GaN-type semiconductor, an active layer made of undoped GaN, and a surface barrier layer made of AlGaN are stacked, for example.

Figure 5E:
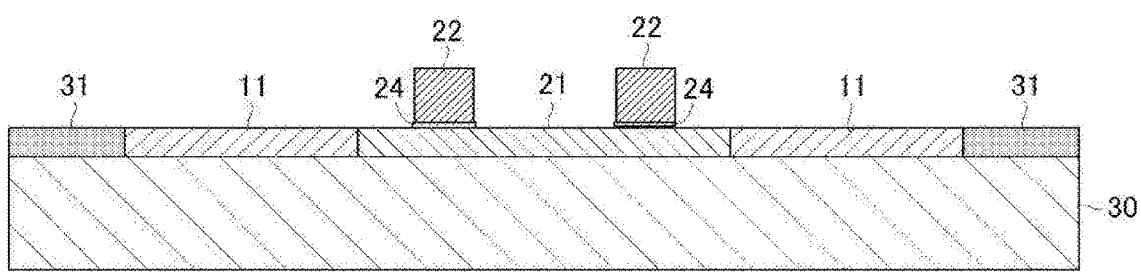
FIG. 5E is a cross-sectional view showing one example of a manufacturing method for a semiconductor device according to an embodiment of the present invention.

Next, the second transistor 20 is formed in the silicon layer 21 by the steps below. First, a gate insulating film 24 having a thickness of approximately 15 nm is formed by thermally oxidizing the surface of the silicon layer 21. Next, as necessary, ion implantation for adjusting the carrier concentration in the surface of the silicon layer 21 is performed, thereby adjusting the threshold voltage Vt of the second transistor 20. Next, a polysilicon film having a thickness of approximately 200 nm is formed using a CVD method to cover the entire surface of the silicon layer 21. Next the polysilicon film is patterned to form the gate electrode 22 (FIG. 5E). The polysilicon film maybe patterned by conventional photolithography and etching techniques. As shown in FIG. 3A, the gate electrode 22 is patterned to have a loop shape along the boundary area between the compound semiconductor layer 11 and the silicon layer 21.

Figure 5F:
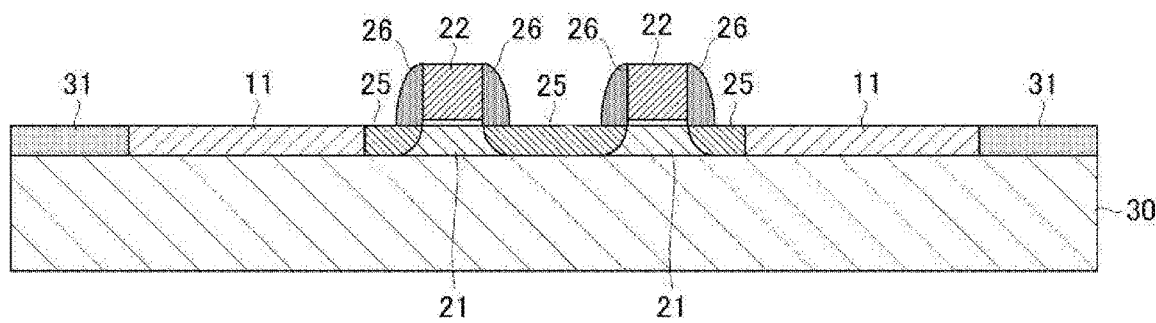
FIG. 5F is a cross-sectional view showing one example of a manufacturing method for a semiconductor device according to an embodiment of the present invention.

Next, arsenic is implanted at a low dose in the surface portion of the silicon layer 21 by an ion implantation technique, to form an LDD 25 (lightly doped drain). Next, using the CVD method, an insulating film made of an insulator such as Si$_3$N$_4$ is formed to a thickness of approximately 100 nm to cover the entire surface of the silicon layer 21, the compound semiconductor layer 11, and the insulating separation film 31, and the insulating film is etched back by anisotropic etching, thereby forming the side walls 26 covering the side faces of the gate electrode 22 (FIG. 5F).

Figure 5G:
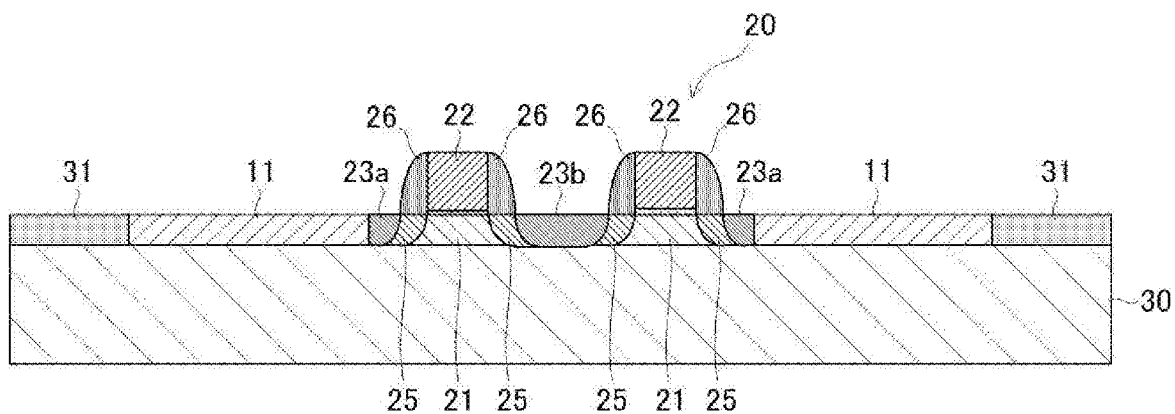
FIG. 5G is a cross-sectional view showing one example of a manufacturing method for a semiconductor device according to an embodiment of the present invention.

Next, arsenic is implanted at a high dose in the surface portion of the silicon layer 21 by ion implantation, to form the n-type drain diffusion layer 23a and source diffusion layer 23b. During this ion implantation, the gate electrode 22 and the side walls 26 function as a portion of the mask, resulting in the drain diffusion layer 23a and the source diffusion layer 23b being formed in a self-aligned manner with respect to the gate electrode 22 and the LDD 25 (FIG. 5G).

By the above steps, the second transistor 20, which is the silicon semiconductor element, is formed in the silicon layer 21 on the sapphire substrate 30. While the processes for forming the second transistor 20 are being performed, the surface of the compound semiconductor layer 11 is appropriately covered by a resist, an insulating film, or the like. Also, a heat treatment process for activating the crystalline layer or eliminating defects thereof, or optimizing the impurity profile may be appropriately added.

Figure 5H:
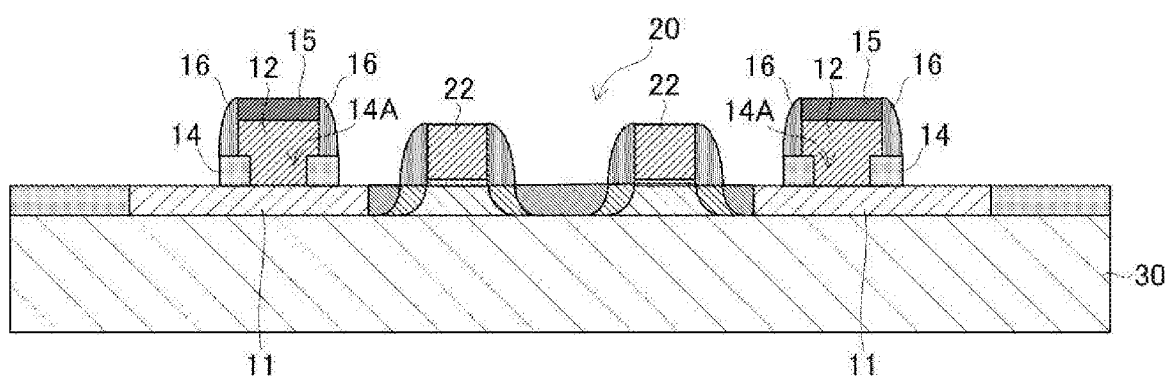
FIG. 5H is a cross-sectional view showing one example of a manufacturing method for a semiconductor device according to an embodiment of the present invention.

Next, the first transistor 10 is formed in the compound semiconductor layer 11 by the steps below. Using the CVD method, the insulating film 14 made of an insulator such as $SiO_2$ is formed to a thickness of approximately 500 nm to cover the entire surface of the compound semiconductor layer 11. Next, using the publicly known photolithography and etching techniques, a portion of the insulating film 14 is removed to form the opening 14A, and the surface of the compound semiconductor layer 11 is exposed through the opening 14A. Next, a conductive film made of a conductor such as $AgO_X$ is formed by vapor deposition or sputtering to a thickness of approximately 400 nm to cover the entire surface of the insulating film 14. The conductive film is embedded in the opening 14A of the insulating film 14 and is in contact with the compound semiconductor layer 11 where the opening 14A is formed. The conductive film and the compound semiconductor layer 11 are in Schottky contact. Next, the insulating film 15 made of an insulator such as $Si_3N_4$ is formed by a CVD method to cover the entire surface of the conductive film and the insulating film 15 is then patterned, thereby forming a hard mask made of the insulating film 15 where the gate electrode 12 is to be formed. Next, the conductive film and the insulating film 14 are sequentially etched with the insulating film 15 as a mask, thereby forming the gate electrode 12 made of the conductive film on the compound semiconductor layer 11 (FIG. 5H). As shown in FIG. 3A, the gate electrode 12 is patterned to have a loop shape that surrounds the outer periphery of the gate electrode 22 of the second transistor 20 and that is parallel to the gate electrode 22.

Next, an insulating film made of an insulator such as $Si_3N_4$ is formed by CVD to a thickness of approximately 150 nm to cover the entire surface of the sapphire substrate 30. Then, by performing anisotropic etching on the insulating film to etch it back, the side walls 16 covering the side faces of the laminate constituted of the gate electrode 12 and the insulating film 15 are formed (FIG. 5H).

Figure 5I:
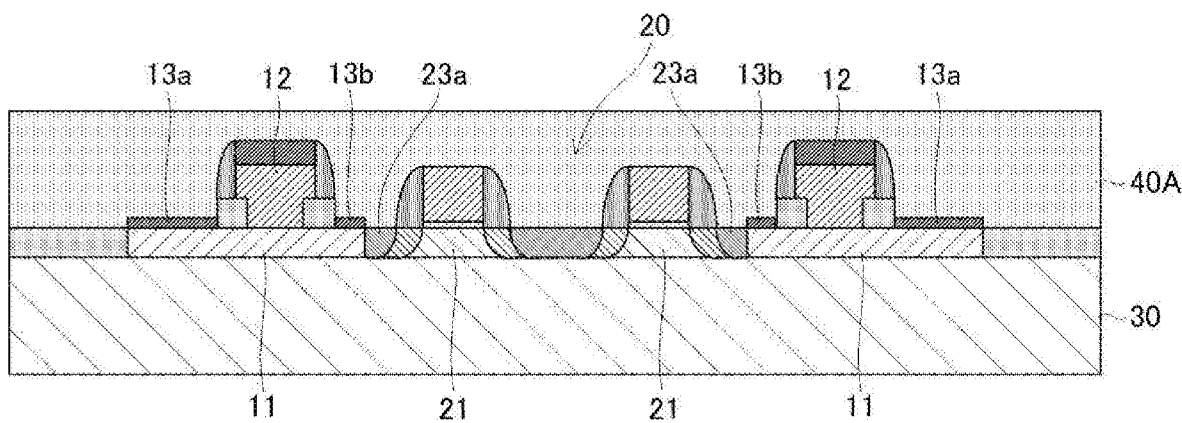
FIG. 5I is a cross-sectional view showing one example of a manufacturing method for a semiconductor device according to an embodiment of the present invention.

Next, the conductive members 13a and 13b made of a metal such as Ti that can be in Ohmic contact with the compound semiconductor layer 11. The conductive members 13a and 13b are formed on positions on the surface of the compound semiconductor layer 11 to sandwich the gate electrode 12 between the conductive members 13a and 13b. The conductive members 13a and 13b may be formed by a sputtering method, for example. The conductive member 13a functions as the drain electrode and the conductive member 13b functions as the source electrode. The conductive member 13b is provided adjacent to the drain diffusion layer 23a of the second transistor 20 formed in the silicon layer 21 (FIG. 5I).

By the above steps, the first transistor 10, which is the compound semiconductor element, is formed in the compound semiconductor layer 11 on the sapphire substrate 30. While the processes for forming the first transistor 10 are being performed, the surface of the second transistor 20 is appropriately covered by a resist, an insulating film, or the like.

Next, an insulating film 40A made of an insulator such as $SiO_2$ is formed by CVD to a thickness of approximately 1200 nm to cover the entire surface of the sapphire substrate 30. Then, using the CMP technique, the surface of the insulating film 40A is planarized (FIG. 5I).

Figure 5J:
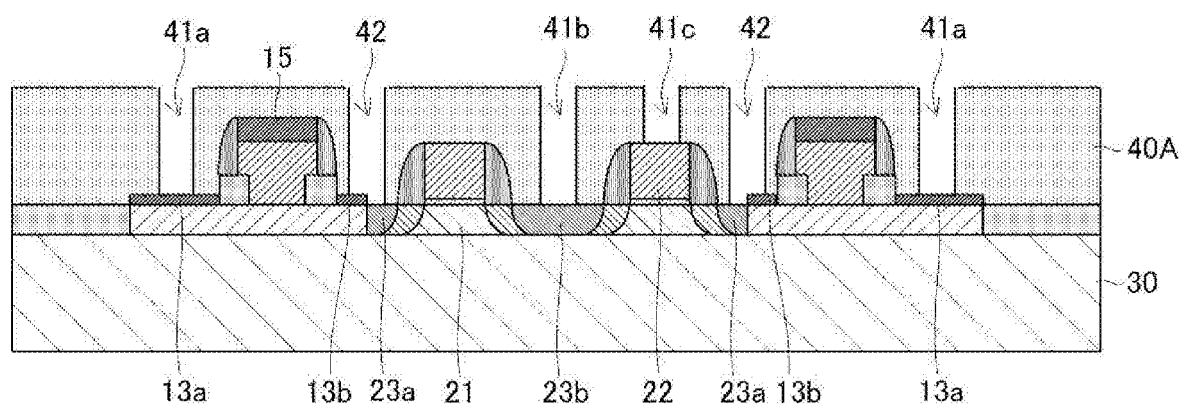
FIG. 5J is a cross-sectional view showing one example of a manufacturing method for a semiconductor device according to an embodiment of the present invention.

Next, contact holes 41a, 41b, and 41c and a trench 42 are formed in the insulating film 40A by conventional photolithography and etching techniques. The contact hole 41a is formed from the surface of the insulating film 40A to the conductive member 13a. The contact hole 41b reaches the source diffusion layer 23b. The contact hole 41c reaches the gate electrode 22. The trench 42 is formed from the surface of the insulating film 40A to the boundary area between the conductive member 13b and the drain diffusion layer 23a, and exposes the surfaces of the conductive member 13b and the drain diffusion layer 23a. The trench 42 is provided along the boundary area (FIG. 5J).

Figure 5K:
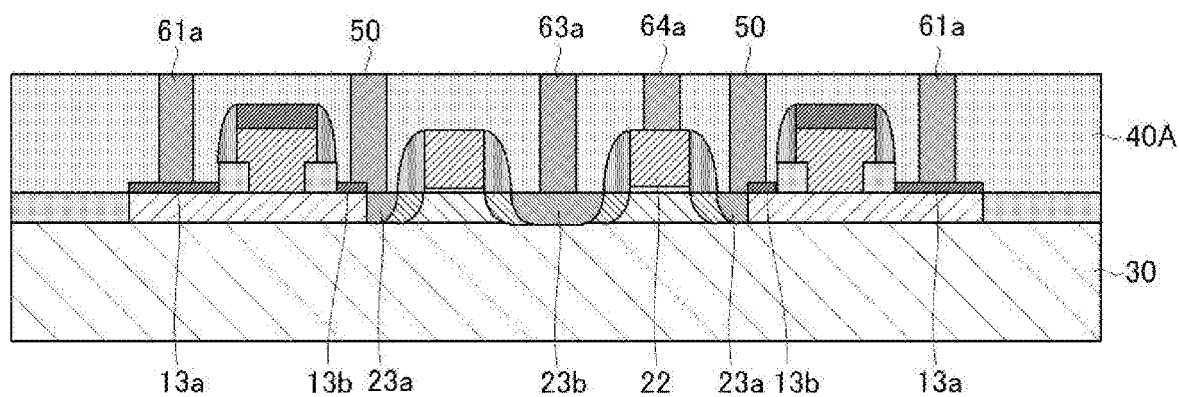
FIG. 5K is a cross-sectional view showing one example of a manufacturing method for a semiconductor device according to an embodiment of the present invention.

Next, a Ti film of approximately 50 nm in thickness and a tungsten film of approximately 1 μm in thickness are sequentially formed by a CVD method to cover the entire surface of the insulating film 40A. As a result, the contact holes 41a to 41c and the trench 42, which were formed in the previous step, are filled with a multilayer film including a titanium film and a tungsten film. Next, using the etch back technique or CMP technique, the excess titanium film and tungsten film deposited on the insulating film 40A are eliminated. As a result, the plug 61a connected to the conductive member 13a, the plug 63a connected to the source diffusion layer 23b, and the plug 64a connected to the gate electrode 22 are formed. Also, the conductor 50 connected to both the conductive member 13b and the drain diffusion layer 23a is formed. The conductor 50 is formed along the boundary area between the conductive member 13b and the drain diffusion layer 23a (boundary area between the compound semiconductor layer 11 and the silicon layer 21) (FIG. 5K).

Figure 5L:
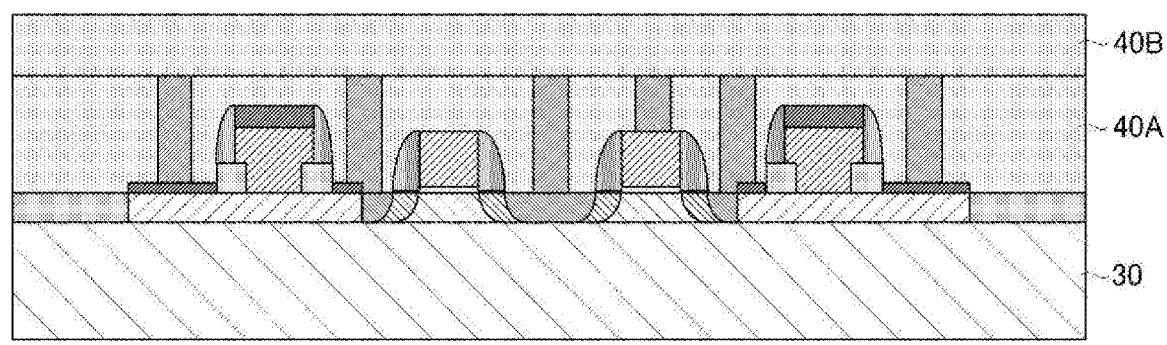
FIG. 5L is a cross-sectional view showing one example of a manufacturing method for a semiconductor device according to an embodiment of the present invention.

Next, an insulating film 40B made of an insulator such as $SiO_2$ is formed on the surface of the insulating film 40A. Then, using the CMP technique, the surface of the insulating film 40B is planarized (FIG. 5L).

Figure 5M:
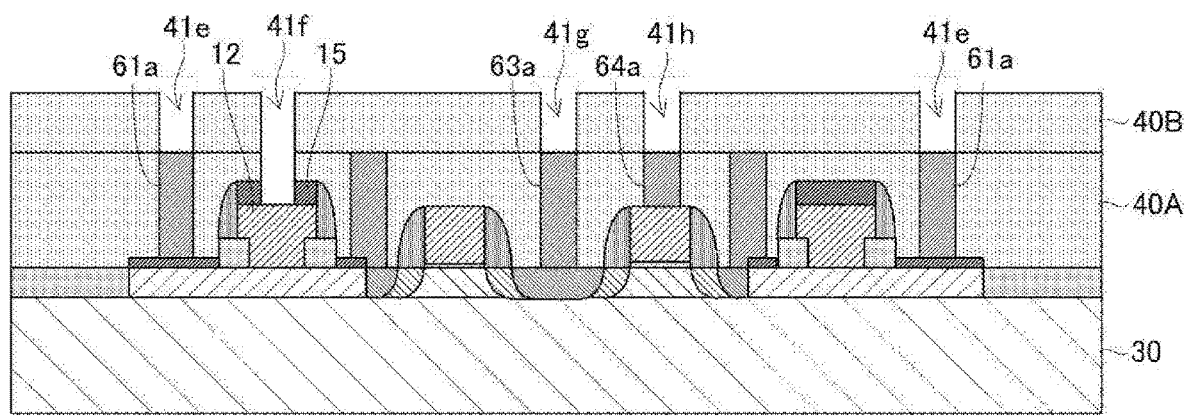
FIG. 5M is a cross-sectional view showing one example of a manufacturing method for a semiconductor device according to an embodiment of the present invention.

Next, contact holes 41e, 41f, 41g, and 41h are formed in the insulating film 40B by photolithography and etching. The contact hole 41e is formed from the surface of the insulating film 40B to the top end of the plug 61a. The contact hole 41f is formed from the surface of the insulating film 40B, penetrates the insulating films 40B, 40A, and 15 and reaches the gate electrode 12. The contact hole 41g is formed from the surface of the insulating film 40B to the top end of the plug 63a. The contact hole 41h is formed from the surface of the insulating film 40B to the top end of the plug 64a (FIG. 5M).

Figure 5N:
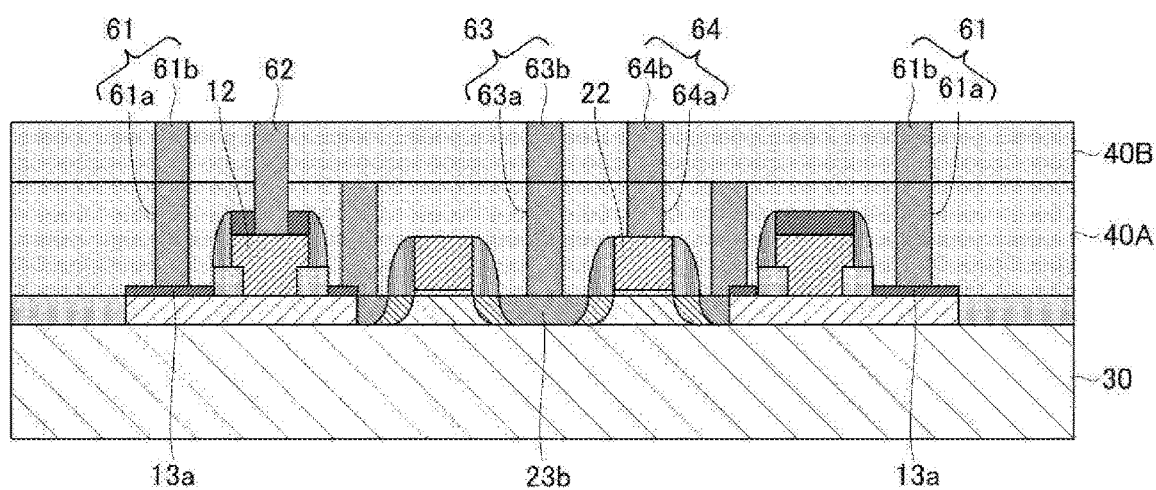
FIG. 5N is a cross-sectional view showing one example of a manufacturing method for a semiconductor device according to an embodiment of the present invention.

Next, a Ti film of approximately 50 nm in thickness and a tungsten film of approximately 1 μm in thickness are sequentially formed by a CVD method to cover the entire surface of the insulating film 40B. As a result, the contact holes 41e to 41h, which were formed in the previous step, are filled with a multilayer film including a titanium film and a tungsten film. Next, using the etch back technique or CMP technique, the excess titanium film and tungsten film deposited on the insulating film 40B are eliminated. As a result, the plug 61b connected to the plug 61a, the plug 62 connected to the gate electrode 12, the plug 63b connected to the plug 63a, and the plug 64b connected to the plug 64a are formed. In other words, the plug 61 connected to the conductive member 13a, the plug 63 connected to the source diffusion layer 23b, and the plug 64 connected to the gate electrode 22 are each formed to have a two-level structure. On the other hand, the plug 62 connected to the gate electrode 12 has a single-level structure (FIG. 5N).

Next, using a sputtering method, a conductive film made of aluminum or an aluminum alloy is formed to a thickness of approximately 1 μm to cover the entire surface of the insulating film 40B. Then, using photolithography and etching techniques, this conductive film is patterned. As a result, the wiring line 72, which is electrically connected to the conductive member 13a through the plugs 61a and 61b, the wiring line 71, which is connected to the gate electrode 12 through the plug 62 and is electrically connected to the source diffusion layer 23b through the plugs 63a and 63b, and the wiring line 73, which is electrically connected to the gate electrode 22 through the plugs 64a and 64b, are formed. The gate electrode 22 of the first transistor 10 and the source diffusion layer 23b of the second transistor 20 are electrically connected through the plug 62, the wiring line 71, and the plugs 63a and 63b (FIG. 5O).

According to the semiconductor device 1 of an embodiment of the present invention, the first transistor 10, which is a compound semiconductor element, and the second transistor 20, which is a silicon semiconductor element, are formed on a single sapphire substrate 30, and thus, it is possible to configure a normally-OFF switch formed by putting these transistors in a cascode connection, using one chip. Thus, it is possible to achieve greater miniaturization compared to a case in which the compound semiconductor element and the silicon semiconductor element are formed on different semiconductor chips.

Here, if the first transistor 10, which is a compound semiconductor element, is an HEMT, for example, it is possible to achieve high speed operation and low ON-resistance. However, if electrical connection to the first transistor 10 is achieved using a wire, high speed operation and low ON-resistance of the first transistor 10 are inhibited by a wire resistance component and an inductance component. In the semiconductor device 1 according to an embodiment of the present invention, the electrical connection between the first transistor 10 and the second transistor 20 is achieved by conductors such as plugs and metal wiring lines provided inside the semiconductor device 1. In other words, according to the semiconductor device 1 of an embodiment of the present invention, the first transistor 10 and the second transistor 20 can be electrically connected without the use of wires. Thus, it is possible to achieve sufficiently high speed operation and low ON-resistance in the first transistor 10.

Also, by adopting a configuration in which the compound semiconductor layer 11 and the silicon layer 21 are arranged on a single sapphire substrate 30, it is possible to simplify the manufacturing process compared to a case in which the compound semiconductor layer and the silicon layer are vertically stacked. Additionally, by forming the compound semiconductor layer 11 and the silicon layer 21 on the sapphire substrate 30, which is an insulating substrate, it is possible to suppress the occurrence of parasitic capacitance. As a result, effects such as mitigation of operational defects in the semiconductor element resulting from parasitic capacitance, mitigation of effects of high voltage application on the compound semiconductor element (first transistor 10) and the silicon semiconductor element (second transistor 20), and mitigation of latch-up can be attained. Also, by suppressing the occurrence of parasitic capacitance, it is possible to achieve high speed operation not only in the compound semiconductor element (first transistor 10) but also the silicon semiconductor element (second transistor 20).

Additionally, according to the semiconductor device 1 of an embodiment of the present invention, the gate electrode 12 of the first transistor 10 and the gate electrode 22 of the second transistor 20 are both formed as endless loops, and the gate electrode 22 of the second transistor 20 is formed to the inside of the gate electrode 12 of the first transistor 10. By this layout, the distance between the conductive member 13b constituting the source electrode of the first transistor 10 and the drain diffusion layer 23a of the second transistor 20 can be set to substantially zero, enabling effective use of the space inside the semiconductor chip. The source of the first transistor 10 and the drain of the second transistor form the primary current path, and it is assumed that a relatively large current flows therein. By reducing the distance between the conductive member 13b and the drain diffusion layer 23a, it is possible to reduce the resistance component on the primary current path and mitigate loss.

Figure 5O:
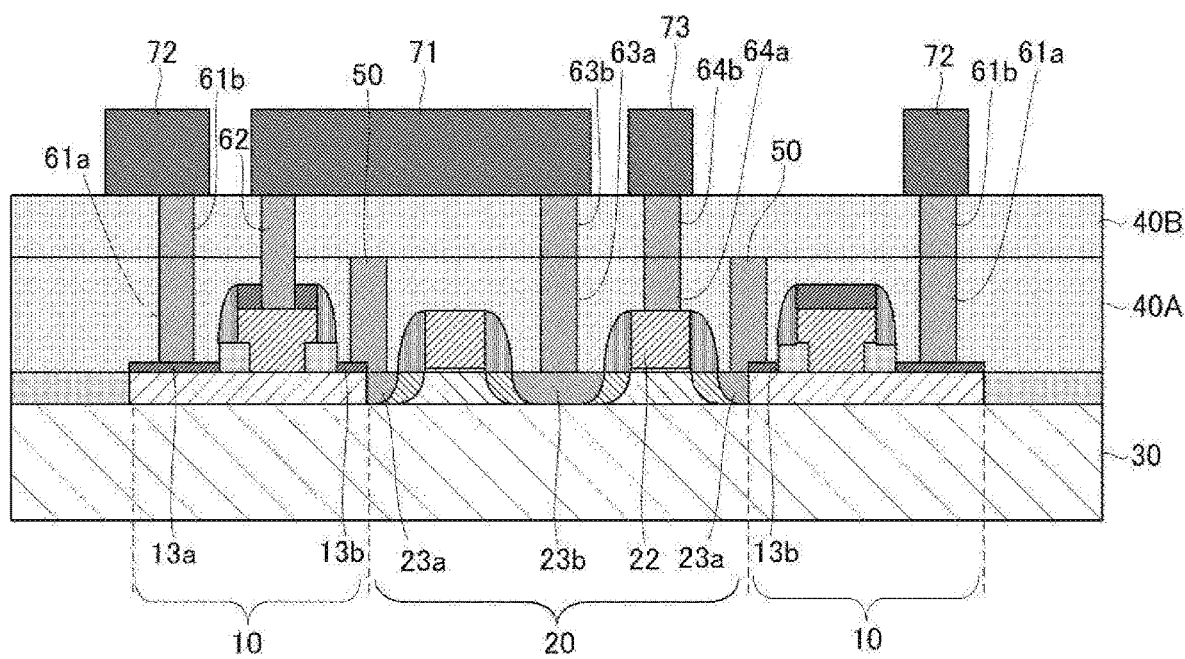
FIG. 5O is a cross-sectional view showing one example of a manufacturing method for a semiconductor device according to an embodiment of the present invention.

Also, according to the semiconductor device 1 of an embodiment of the present invention, as shown in FIG. 5O, the first transistor 10 and the second transistor 20 are covered by the two layers of the insulating films 40A and 40B, and the conductor 50, which connects the conductive member 13b constituting the source electrode of the first transistor 10 to the drain diffusion layer 23a of the second transistor 20, is embedded in the insulating film 40A, which is the lower layer. As a result, it is possible to increase the flexibility in laying out the wiring lines formed on the insulating film 40B, which is the upper layer.

Also, the top surface of the gate electrode 12 of the first transistor 10 is covered by the insulating film 15, which functions as a hard mask and is made of $Si_3N_4$. If, hypothetically, the formation of the contact hole reaching the gate electrode 12 of the first transistor 10 and the formation of the other contact holes 41a to 41c (see FIG. 5J) were to be performed simultaneously, then as a result of the fact that the etching rate of the insulating film 15 made of $Si_3N_4$ is lower than the etching rate of the insulating film 40A made of $SiO_2$, there is a risk that the contact hole 41b reaching the silicon layer 21 would penetrate the silicon layer 21. To address this, in the manufacturing method for the present embodiment, after forming the plug 63a by embedding a conductor in the contact hole 41b reaching the silicon layer 21, the insulating film 40B is layered onto the insulating film 40A, and the contact hole 41f reaching the gate electrode 12 and the contact hole 41g reaching the plug 63a are formed (see FIG. 5M). As a result, when performing etching to form the contact hole 41g, the plug 63a is etched, which means that the etching rate is very low. Thus, it is possible to prevent the silicon layer 21 from being completely penetrated when forming the contact hole 41f to reach the gate electrode 12.

In the description above, an example was described of a case in which the second transistor 20, which is a silicon semiconductor element, is disposed to the inside of the first transistor 10, which is a compound semiconductor element, but the arrangement of the first transistor 10 and the second transistor 20 may be reversed, with the first transistor 10 being disposed to the inside of the second transistor 20 formed as a loop.

Also, the electrical connection between the conductive member 13b constituting the source electrode of the first transistor 10 and the drain diffusion layer 23a of the second transistor 20, which are disposed adjacent to each other, can be achieved by various methods. FIGS. 6A to 6D are cross-sectional views illustrating a method of connecting the conductive member 13b constituting the source electrode of the first transistor 10 to the drain diffusion layer 23a of the second transistor 20.

Figure 6A:
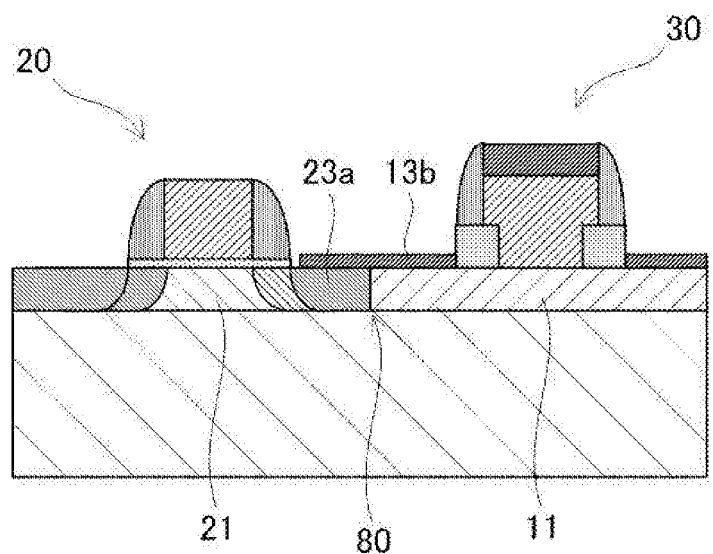
FIG. 6A is a cross-sectional view illustrating a method of connecting a conductive member constituting a source electrode of a first transistor according to an embodiment of the present invention to a drain diffusion layer of a second transistor.

In the example shown in FIG. 6A, the conductive member 13b constituting the source electrode of the first transistor 10 straddles a boundary area 80 between the compound semiconductor layer 11 and the silicon layer 21 and extends to the surface of the drain diffusion layer 23a of the second transistor 20, and thus, the conductive member 13b is electrically connected to the drain diffusion layer 23a.

Figure 6B:
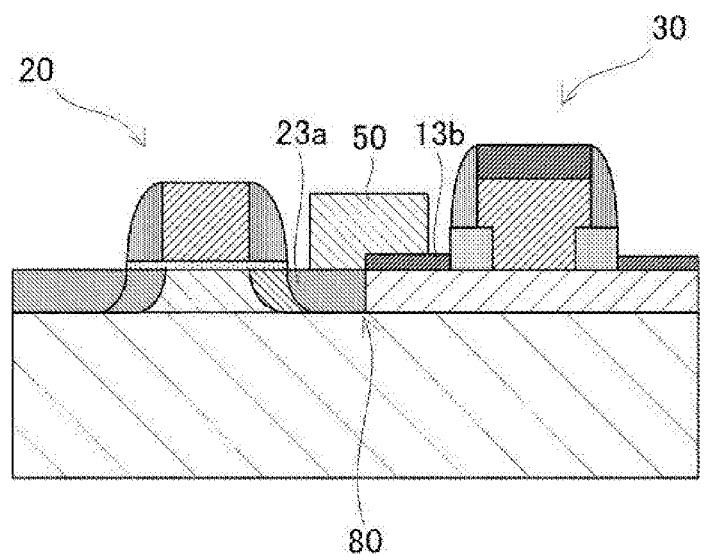
FIG. 6B is a cross-sectional view illustrating a method of connecting a conductive member constituting a source electrode of a first transistor according to an embodiment of the present invention to a drain diffusion layer of a second transistor.
Figure 6C:
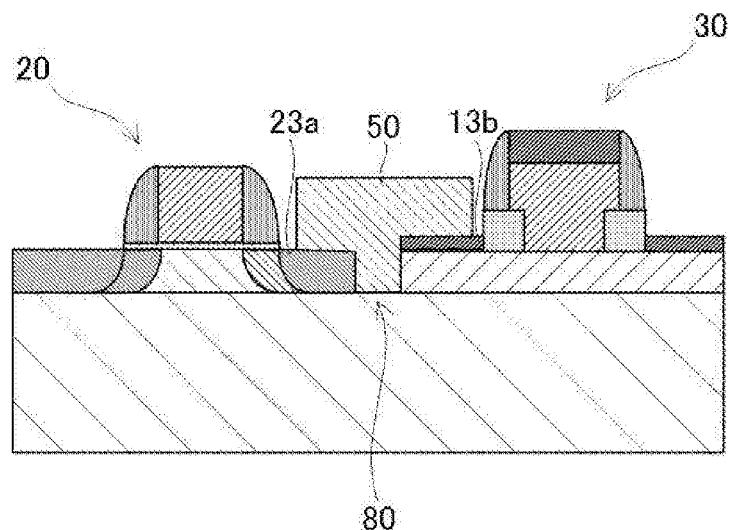
FIG. 6C is a cross-sectional view illustrating a method of connecting a conductive member constituting a source electrode of a first transistor according to an embodiment of the present invention to a drain diffusion layer of a second transistor.
Figure 6D:
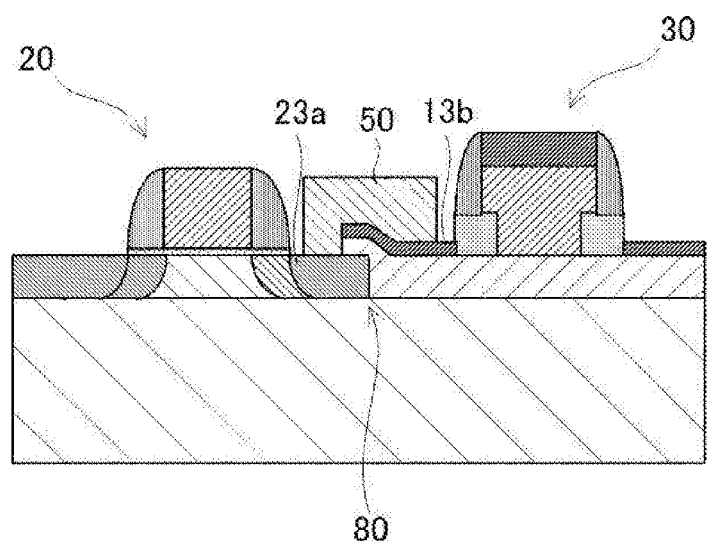
FIG. 6D is a cross-sectional view illustrating a method of connecting a conductive member constituting a source electrode of a first transistor according to an embodiment of the present invention to a drain diffusion layer of a second transistor.

In the examples shown in FIGS. 6B, 6C, and 6D, the conductive member 13b and the drain diffusion layer 23a are electrically connected to each other by the conductor 50, which straddles the boundary area 80 between the compound semiconductor layer 11 and the silicon layer 21. FIG. 6B shows a case in which the compound semiconductor layer 11 and the silicon layer 21 are in contact with each other, FIG. 6C shows a case in which the compound semiconductor layer 11 and the silicon layer 21 are disposed at a distance from each other, and FIG. 6D shows a case in which an end of the compound semiconductor layer 11 extends onto the surface of the silicon layer 21. The conductor 50 may be plug in the form of a cylinder or a polygonal column, or may have a linear shape extending along the boundary area between the compound semiconductor layer 11 and the silicon layer 21.

Figure 7:
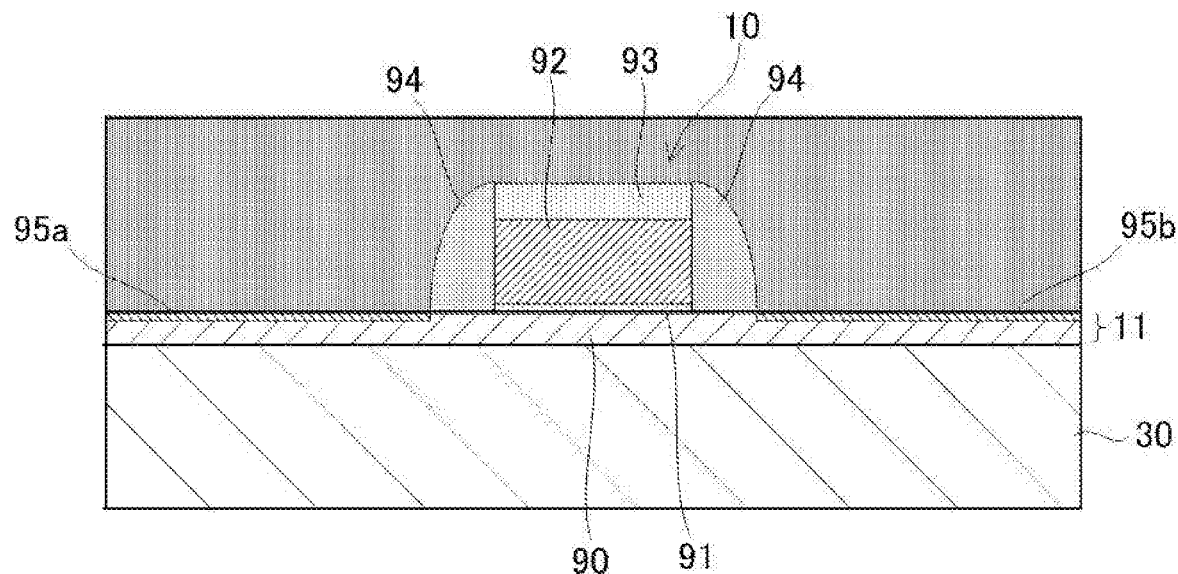
FIG. 7 is a cross-sectional view showing another example of a compound semiconductor element according to an embodiment of the present invention.

Also, in the present embodiment, an example was described in which a MESFET is used as the first transistor 10 provided in the compound semiconductor layer 11, but the configuration is not limited to this example. FIG. 7 is a cross-sectional view showing another example of the first transistor 10, which is the compound semiconductor element, formed in the compound semiconductor layer 11. FIG. 7 shows a MOSFET as another example of the first transistor 10.

The MOSFET has a body portion 90 formed in the compound semiconductor layer 11. On the surface of the body portion 90, a gate insulating film 91 made of an insulator such as $Al_2O_3$ and a gate electrode 92 made of a conductor such as $AgO_X$ are layered in the stated order. The surface of the gate electrode 92 is covered by an insulating film 93 made of an insulator such as $SiO_2$. The side faces of the laminate constituted of the gate insulating film 91, the gate electrode 92, and the insulating film 93 are covered by side walls 94 made of an insulator such as $Si_3N_4$. The conductive member 95a functioning as the drain electrode and the conductive member 95b functioning as the source electrode are provided at positions on the surface of the body portion 90 to sandwich the gate electrode 92 between the conductive member 95a and the conductive member 95b. The conductive members 95a and 95b are made of a metal such as Ti that can be in Ohmic contact with the compound semiconductor layer 11. In FIG. 7, plugs, wiring lines, and the like that are electrically connected to the gate electrode 92 and the conductive members 95a and 95b are omitted in the drawing.

Embodiment 2

Figure 8:
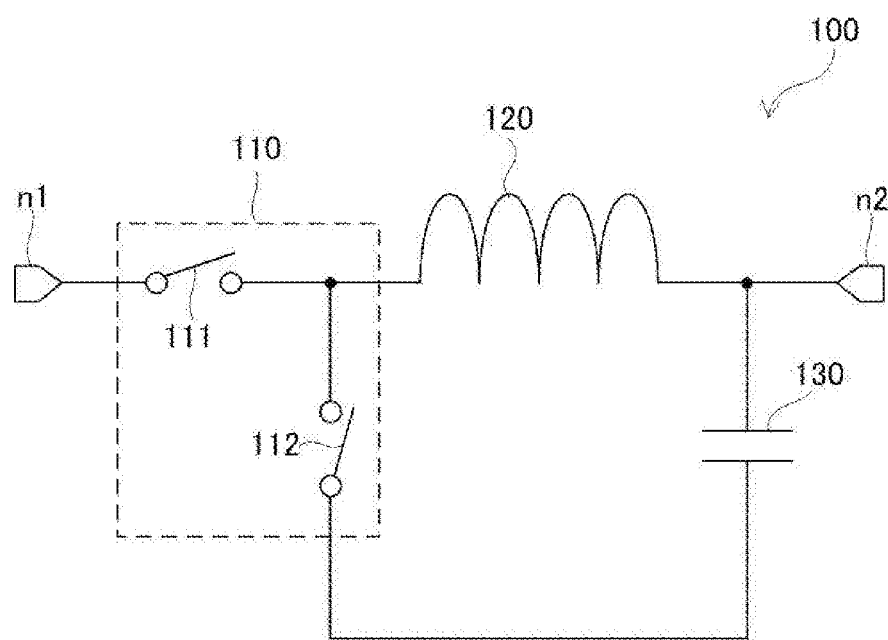
FIG. 8 shows a configuration of a step-down DC-DC converter that is an example of a system according to an embodiment of the present invention.

FIG. 8 shows a configuration of a step-down DC-DC converter 100 that is an example of a system according to Embodiment 2 of the present invention, which is configured to include a normally-OFF switch.

The DC-DC converter 100 includes a switching circuit 110, an inductor 120, and a capacitor 130. The switching circuit 110 has normally-OFF switches 111 and 112. A first end of the switch 111 is connected to an input node n1 and a second end thereof is connected to a first end of the inductor 120 and a first end of the switch 112. The second end of the switch 112 is connected to the first end of the capacitor 130. The second end of the inductor 120 and the second end of the capacitor 130 are connected to an output node n2. By the DC-DC converter 100 repeating the operation of alternately turning ON and OFF the switches 111 and 112, the direct current voltage inputted to the input node n1 is lowered to a prescribed level, and the voltage at this level is outputted from the output node n2.

Figure 9:
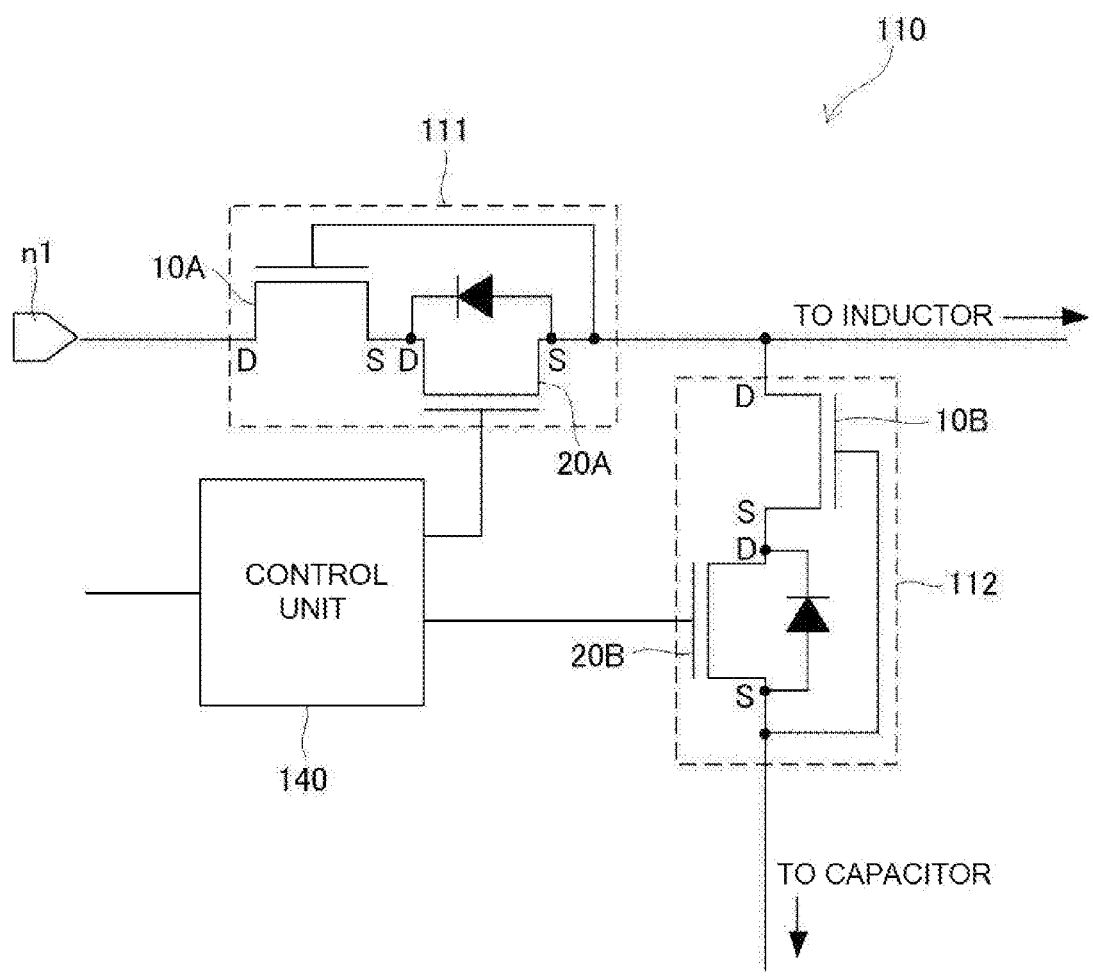
FIG. 9 shows a detailed configuration of a switching circuit according to an embodiment of the present invention.

FIG. 9 shows a detailed configuration of the switching circuit 100. The switch 111 includes a first transistor 10A that is a compound semiconductor element and a second transistor 20A that is a silicon semiconductor element in a cascode connection with each other. Similarly, the switch 112 includes a first transistor 10B that is a compound semiconductor element and a second transistor 20B that is a silicon semiconductor element in a cascode connection with each other. The drain of the first transistor 10A of the switch 111 is connected to the input node n1, and the source of the second transistor 20A of the switch 111 is connected to the drain of the first transistor 10B of the switch 112 and the first end of the inductor 120. The source of the second transistor 20B of the switch 112 is connected to the first end of the capacitor 130.

The gate of the second transistor 20A of the switch 111 and the gate of the second transistor 20B of the switch 112 are respectively connected to the control unit 140. The control unit 140 supplies a control signal to the gates of the second transistors 20A and 20B, thereby controlling the switches 111 and 112 to be ON or OFF. By the switches 111 and 112 being alternately turned ON and OFF according to the control signal supplied from the control unit 140, a step-down operation can be realized by the DC-DC converter 100.

The first transistors 10A and 10B, the second transistors 20A and 20B, and the control unit 140 may be provided on the same sapphire substrate. That is, the switching circuit 110 including the switches 111 and 112 and the control unit 140 may be formed on one chip.

Figure 10:
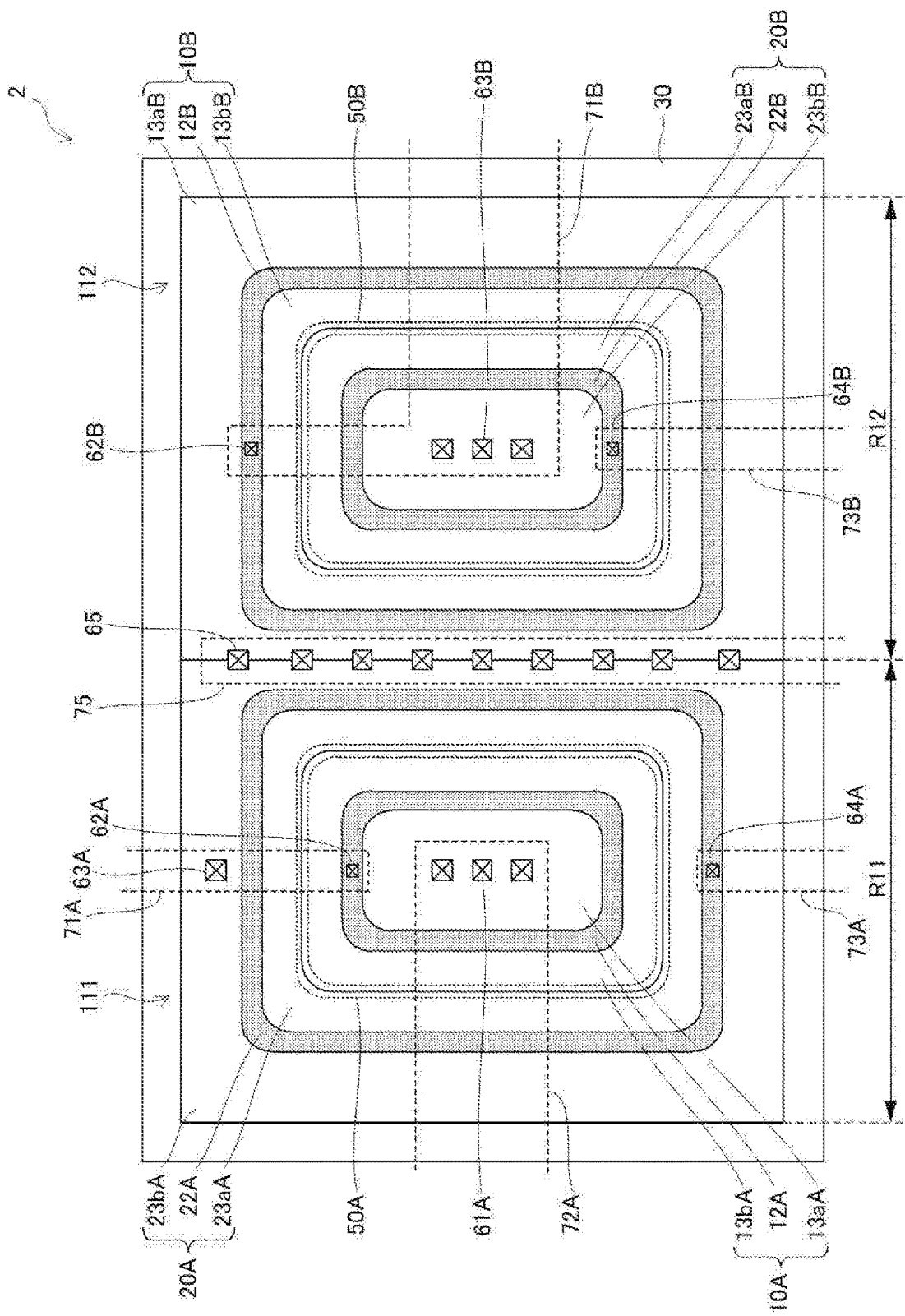
FIG. 10 is a plan view showing an example of a layout of a semiconductor device according to an embodiment of the present invention.

FIG. 10 is a plan view showing an example of a layout of a semiconductor device 2 according to Embodiment 2 of the present invention including the switches 111 and 112. The first transistor 10A and the second transistor 20A constituting the switch 111 are provided in a region R11 on the sapphire substrate 30, and the first transistor 10B and the second transistor 20B constituting the switch 112 are provided in a region R12 on the sapphire substrate 30.

The layout of the switch 112 is similar to that shown in FIG. 3A. That is, the second transistor 20B, which is a silicon semiconductor element, is disposed to the inside of the first transistor 10B, which is a compound semiconductor element having a loop shape. In the first transistor 10B, a conductive member 13aB constituting the drain electrode is disposed to the outside of a gate electrode 12B having a loop shape, and a conductive member 13bB constituting the source electrode is disposed to the inside of the gate electrode 12B. In the second transistor 20B, a drain diffusion layer 23aB is disposed to the outside of a gate electrode 22B having a loop shape, and a source diffusion layer 23bB is disposed to the inside of the gate electrode 22B. The conductive member 13bB constituting the source electrode of the first transistor 10B and the drain diffusion layer 23aB of the second transistor 20B are adjacent to each other, and are electrically connected to each other by a conductor 50B that straddles the boundary area between the compound semiconductor layer and the silicon layer. The gate electrode 12B of the first transistor 10B and the source diffusion layer 23bB of the second transistor 20B are electrically connected through plugs 62B and 63B to a wiring line 71B. The gate electrode 22B of the second transistor 20B is connected through the plug 64B to a wiring line 73B.

On the other hand, in the switch 111, the first transistor 10A, which is a compound semiconductor element, is disposed to the inside of the second transistor 20A, which is a silicon semiconductor element having a loop shape. In the first transistor 10A, a conductive member 13bA constituting the source electrode is disposed to the outside of a gate electrode 12A having a loop shape, and a conductive member 13aA constituting the drain electrode is disposed to the inside of the gate electrode 12A. In the second transistor 20A, a source diffusion layer 23bA is disposed to the outside of a gate electrode 22A having a loop shape, and a drain diffusion layer 23aA is disposed to the inside of the gate electrode 22A. The conductive member 13bA constituting the source electrode of the first transistor 10A and the drain diffusion layer 23aA of the second transistor 20A are adjacent to each other, and are electrically connected to each other by a conductor 50A that straddles the boundary area between the compound semiconductor layer and the silicon layer. The gate electrode 12A of the first transistor 10A and the source diffusion layer 23bA of the second transistor 20A are electrically connected through plugs 62A and 63A to a wiring line 71A. The conductive member 13aA constituting the drain electrode of the first transistor 10A is connected through the plug 61A to a wiring line 72A. The gate electrode 22A of the second transistor 20A is connected through the plug 64A to a wiring line 73A.

The source diffusion layer 23bA of the second transistor 20A constituting the switch 111 and the conductive member 13aB constituting the drain electrode of the first transistor 10B constituting the switch 112 are adjacent to each other, and are connected to a wiring line 75 through a plurality of plugs 65 that straddle the boundary area between the switch 111 and the switch 112.

The wiring line 72A is connected to the input node n1 (see FIGS. 8 and 9) and the wiring line 71B is connected to the first end of the capacitor 130 (see FIG. 8). The wiring line 75 is connected to the first end of the inductor 120 (see FIG. 8) and the wiring lines 73A and 73B are connected to the control unit 140 (see FIG. 9).

According to the DC-DC converter 100 of the present embodiment, the first transistors 10A and 10B, which are compound semiconductor elements, can perform high speed operation, and thus, the switches 111 and 112 can perform high speed operation. As a result, it is possible to reduce the inductance of the inductor 120 and the capacitance of the capacitor 130, enabling a reduction in size of the inductor 120 and the capacitor 130. Therefore, it is possible to realize miniaturization of the DC-DC converter 100 itself. Also, by using the layout shown in FIG. 10 for the switches 111 and 112, it is possible to make effective use of the space inside the semiconductor chip, and to realize miniaturization of the semiconductor device.

DESCRIPTION OF REFERENCE CHARACTERS 1, 2 semiconductor device
10, 10A, 10B first transistor
11 compound semiconductor layer
12, 12A, 12B gate electrode
13a, 13b, 13aA, 13aB, 13bA, 13bB conductive member
20, 20A, 20B second transistor
21 silicon layer
22, 22A, 22B gate electrode
23a, 23aA, 23aB drain diffusion layer
23b, 23bA, 23bB source diffusion layer
30 sapphire substrate
40 insulating film
61, 62, 63, 64, 65 plug
71, 72, 73, 75 wiring line
100 DC-DC converter
111 switch
112 switch
120 inductor
130 capacitor

What is claimed is:

1. A semiconductor device, comprising:
an insulating substrate including a surface having a first region and a second region different from the first region;
a compound semiconductor layer provided directly on the surface of the insulating substrate in the first region of the surface of the insulating substrate; and
a silicon layer provided directly on the surface of the insulating substrate in the second region of the surface of the insulating substrate.

2. The semiconductor device according to claim 1, wherein the compound semiconductor layer includes a compound semiconductor other than an oxide semiconductor.

3. The semiconductor device according to claim 1, further comprising:
a first gate electrode provided on a surface of the compound semiconductor layer;
a pair of conductive members provided at positions on the surface of the compound semiconductor layer to sandwich the first gate electrode between the pair of conductive members;
a second gate electrode provided on a surface of the silicon layer;
a pair of diffusion layers provided at positions in the silicon layer to sandwich the second gate electrode between the pair of diffusion layers,
wherein one of the pair of conductive members is electrically connected to one of the pair of diffusion layers.

4. The semiconductor device according to claim 3, wherein the silicon layer and the compound semiconductor layer are provided adjacent to each other, and
wherein the one of the pair of conductive members and the one of the pair of diffusion layers are electrically connected to each other by a conductor that straddles a boundary area between the compound semiconductor layer and the silicon layer, the conductor contacting the insulating substrate.

5. The semiconductor device according to claim 3, wherein the one of the pair of conductive members extends to a surface of the one of the pair of diffusion layers and is electrically connected to the surface of the one of the pair of diffusion layers.

6. The semiconductor device according to claim 3, wherein one conductive member of the pair of conductive members constitutes a source electrode and another conductive member of the pair of conductive members constitutes a drain electrode of a first transistor provided in the compound semiconductor layer, wherein one diffusion layer of the pair of diffusion layers constitutes a source diffusion layer and another diffusion layer of the pair of diffusion layers constitutes a drain diffusion layer of a second transistor provided in the silicon layer, wherein the source electrode is electrically connected to the drain diffusion layer, and wherein the first gate electrode is electrically connected to the source diffusion layer.

7. The semiconductor device according to claim 6, wherein the first transistor is a MOSFET.

8. The semiconductor device according to claim 6, wherein the first transistor is a MESFET.

9. The semiconductor device according to claim 3, wherein the first gate electrode, the second gate electrode, the pair of conductive members, and the pair of diffusion layers each have a loop shape, and wherein the second gate electrode and the pair of diffusion layers are is provided at a position surrounding the first gate electrode and the pair of conductive members or are provided to an inner side of the loop shape of the first gate electrode and the pair of diffusion layers.

10. The semiconductor device according to claim 1, wherein the insulating substrate is a sapphire substrate.

11. The semiconductor device according to claim 1, wherein the compound semiconductor layer contains GaN.

12. A semiconductor device, comprising:
an insulating substrate;
a diffusion layer formed in a silicon layer provided on the insulating substrate;
a conductive member formed on a surface of a compound semiconductor layer provided on the insulating substrate; and
a conductor in direct contact with each of the silicon layer and the compound semiconductor layer and electrically connecting the diffusion layer and the conductive member.

13. The semiconductor device according to claim 12, wherein the insulating substrate is a sapphire substrate.

14. The semiconductor device according to claim 12, further comprising:
a first gate electrode provided on a surface of the compound semiconductor layer;
a pair of conductive members provided at positions on the surface of the compound semiconductor layer to sandwich the first gate electrode between the pair of conductive members;
a second gate electrode provided on a surface of the silicon layer; and
a pair of diffusion layers provided at positions in the silicon layer to sandwich the second gate electrode between the pair of diffusion layers,
wherein one of the pair of conductive members is electrically connected to one of the pair of diffusion layers.

15. The semiconductor device according to claim 14, wherein the silicon layer and the compound semiconductor layer are provided adjacent to each other, and
wherein the one of the conductive members and the one of the diffusion layers are electrically connected to each other by the conductor that straddles a boundary area between the compound semiconductor layer and the silicon layer.

16. A semiconductor device, comprising:
a compound semiconductor element that is formed in a compound semiconductor layer provided on an insulating substrate, a first end of the compound semiconductor element being electrically connected to an input node; and
a silicon semiconductor element that is formed in a silicon layer provided on the insulating substrate, and that is electrically connected to a second end of the compound semiconductor element,
wherein the compound semiconductor layer and the silicon layer are formed to a same height from the insulating substrate.

* * * * *